(12) United States Patent
Imamura

(10) Patent No.: US 7,663,306 B2
(45) Date of Patent: Feb. 16, 2010

(54) ELECTROOPTIC DEVICE, METHOD FOR PRODUCING THE SAME, AND ELECRONIC APPARATUS

(75) Inventor: Yoichi Imamura, Yokohama (JP)

(73) Assignee: Seiko Epson Corporation, Tokyo (JP)

(*) Notice: Subject to any disclaimer, the term of this patent is extended or adjusted under 35 U.S.C. 154(b) by 537 days.

(21) Appl. No.: 11/300,323

(22) Filed: Dec. 15, 2005

(65) Prior Publication Data

US 2006/0158095 A1    Jul. 20, 2006

(30) Foreign Application Priority Data

Jan. 20, 2005    (JP)    ............... 2005-012400

(51) Int. Cl.
*H01J 1/62* (2006.01)
*H01J 63/04* (2006.01)

(52) U.S. Cl. .................. 313/506; 313/489; 313/503; 313/505; 313/512; 315/161

(58) Field of Classification Search ......... 313/498–512; 315/161
See application file for complete search history.

(56) References Cited

U.S. PATENT DOCUMENTS

| | | | | |
|---|---|---|---|---|
| 4,025,896 | A * | 5/1977 | Hintze et al. ................. | 362/253 |
| 6,420,834 | B2 * | 7/2002 | Yamazaki et al. ........ | 315/169.3 |
| 6,559,594 | B2 * | 5/2003 | Fukunaga et al. ........... | 313/506 |
| 6,593,691 | B2 * | 7/2003 | Nishi et al. .................. | 313/506 |
| 6,873,100 | B2 * | 3/2005 | Park et al. .................... | 313/506 |
| 6,900,470 | B2 | 5/2005 | Kobayashi et al. | |
| 7,009,340 | B2 | 3/2006 | Asai et al. | |
| 7,026,658 | B2 * | 4/2006 | Park et al. .................... | 257/98 |
| 7,214,966 | B2 | 5/2007 | Park et al. | |
| 7,214,967 | B2 | 5/2007 | Park et al. | |
| 7,291,973 | B2 * | 11/2007 | Ishihara et al. .............. | 313/505 |
| 7,365,487 | B2 * | 4/2008 | Matsuura et al. ............ | 313/506 |
| 2004/0189185 | A1 | 9/2004 | Yotsuya | |
| 2004/0211964 | A1 * | 10/2004 | Sakakura et al. ............... | 257/72 |
| 2004/0238827 | A1 * | 12/2004 | Takayama et al. ............. | 257/79 |
| 2005/0008894 | A1 * | 1/2005 | Hiruma et al. .............. | 428/690 |

FOREIGN PATENT DOCUMENTS

| | | |
|---|---|---|
| JP | A 5-307997 | 11/1993 |
| JP | A 11-329743 | 11/1999 |
| JP | A-2002-026473 | 1/2002 |
| JP | A 2002-40961 | 2/2002 |

(Continued)

*Primary Examiner*—Nimeshkumar D. Patel
*Assistant Examiner*—Thomas A Hollweg
(74) *Attorney, Agent, or Firm*—Oliff & Berridge, PLC

(57) ABSTRACT

An electrooptic device includes a first substrate and a second substrate. The first substrate includes an electrooptic element in which an electrooptic substance is interposed between a first electrode and a second electrode, the electrooptic element being disposed on a surface of the first substrate that opposes the second substrate; an electronic element for driving the electrooptic element; and a power supply wire for supplying power to at least one of the electrooptic element and the electronic element. The second substrate includes a second auxiliary wire for supplying auxiliary power to at least one of the electrooptic element and the electronic element, the second auxiliary wire being disposed on a surface of the second substrate that opposes the first substrate, the second auxiliary wire having a planar shape that corresponds with a non-opening region of the electrooptic element.

12 Claims, 15 Drawing Sheets

FOREIGN PATENT DOCUMENTS

| | | |
|---|---|---|
| JP | A-2002-116306 | 4/2002 |
| JP | A-2004-101945 | 4/2004 |
| JP | A-2004-146200 | 5/2004 |
| JP | A 2004-178839 | 6/2004 |
| JP | A-2004-241130 | 8/2004 |
| JP | A-2004-281399 | 10/2004 |
| KR | A 2002-0082138 | 10/2002 |
| KR | A 10-2004-0007823 | 1/2004 |

\* cited by examiner

ELECTROOPTIC DEVICE, METHOD FOR PRODUCING THE SAME, AND ELECRONIC APPARATUS

BACKGROUND

1. Technical Field

The present invention relates to the technical fields of electrooptic devices, such as organic electroluminescent (EL) devices, production methods therefor, and various electronic apparatuses including the electrooptic devices.

2. Related Art

In electrooptic devices, such as organic EL devices and silicon light-emitting devices, that include solid thin films and are driven and controlled by active elements such as TFTs, the electrodes and power supply wires of the electrooptic devices are composed of thin films. Even when these electrodes and power supply wires are composed of low-resistance metal materials, the resistance of the electrode and power supply wire causes the power voltage to decrease with the increase in size and output (brightness) of the electrooptic devices. This also affects the operation properties of the electrooptic devices. When the electrooptic devices is a display device of an active drive type in which power is supplied to a plurality of pixels arranged in a matrix over the entire image display region including the end portions, the voltage drop is particularly large at a location far from the power terminal. As a result, unevenness in brightness in the image display region readily occurs.

FIG. 6 shows the rate of decrease in brightness in the entire display during the full white display according to the structure of a related art, and FIG. 7 shows an example of unevenness in brightness. The difference in brightness between the display center and display end portions is preferably up to 3-2% in realizing a high quality display by increasing the size of a high-definition, light-emitting display device, such as a high definition television (HDTV). Even when the current of the light-emitting device of each pixel is 15 μA or lower, the power current in a display device having a diagonal size of 40 inches or more is on the ampere order. Thus, the resistance of the power supply wire for supplying power to each column of the pixels must be 11Ω or less and the power voltage drop must be 0.2 V or less. Moreover, as shown in FIG. 7, when a white square is displayed at the center of the red back ground over the entire image display region, bright red regions appear at the left and right of the white square and dark red regions appear above and below the white square because of the unevenness in brightness described above.

Consequently, in attempting to apply the device to a thin-film light-emitting device of an active drive type, such as an organic EL display device, by increasing the size, the thickness of the wiring (power supply wire) cannot be simply increased. The feasible thickness is about 200 to 300 nm from the standpoint of economically planarizing the step differences. Furthermore, in order to form a full color display, the width of the power supply wire for each pixel column must be one third of the width of the pixel or less. Accordingly, in an active light-emitting devices in the related art, the difference in brightness between high-brightness pattern and display patterns around the high-brightness pattern shown in FIG. 7 is at least 5% to 10% due to the limitations in thickness and width of the power supply wire and the resistance of the wiring materials. Thus, the display quality is significantly degraded, and increasing the size, the resolution, and/or the brightness of the device is difficult.

In view of the above, various techniques for decreasing the resistance of the power supply wire have been proposed (refer to Japanese Unexamined Patent Application Publication Nos. 11-329743, 5-307997, 2002-40961, and 2004-178839.

SUMMARY

However, the above-described related techniques have a limit in reducing the resistance due to the power supply wire. Moreover, due to the limitations derived from planarizing technology for laminating active drive elements and organic EL elements and damages inflicted therefrom, reduction of electrode resistance has been complicated and difficult. Moreover, the provided solution did not satisfy conflicting requirements, such as brightness and driving current, required for electrooptic devices.

An advantage of the present invention is that it provides an electrooptic device that has reduced optical variation in electrooptic conversion regions, achieves high reliability, and realizes high-quality conversion; and a method for making the electrooptic device. Various electronic apparatuses incorporating such electrooptic devices are also provided.

A first embodiment of the invention provides an electrooptic device that includes a first substrate and a second substrate. The first substrate includes an electrooptic element in which an electrooptic substance is interposed between a first electrode and a second electrode, the electrooptic element being disposed on a surface of the first substrate that opposes the second substrate; an electronic element for driving the electrooptic element; and a power supply wire for supplying power to at least one of the electrooptic element and the electronic element. The second substrate includes a second auxiliary wire for supplying auxiliary power to at least one of the electrooptic element and the electronic element, the second auxiliary wire being disposed on a surface of the second substrate that opposes the first substrate, the second auxiliary wire having a planar shape that corresponds with a non-opening region of the electrooptic element.

With this structure, power is supplied to at least one of the electrooptic element and the electronic element through the power supply wire during operation. This induces electrooptic operation in the electrooptic element including the electrooptic substance sandwiched between the electrodes. Here, auxiliary power is supplied to the second auxiliary wire having a low resistance. Thus, although the resistance of the power supply wire is high, it becomes possible to reduce the voltage drop caused by the power supply wire. For the purpose of this specification, the term "electrooptic substance" refers to a substance that converts electrical signals to light and vice versa. One example thereof is an organic light-emitting substance. The term "electronic element" refers to, for example, an active element such as a thin film transistor (TFT) and may include passive elements, such as storage capacitors. In an organic EL device of an active matrix type, one organic EL element is provided for each unit circuit, and is driven and controlled by the circuit.

In this invention, some of the components that have been formed on the first substrate are moved onto the second substrate, and the first substrate and second substrate are made in separate processes. For example, by forming auxiliary wires of the power supply wire on the second substrate, it becomes possible to form auxiliary wires having a complicated shape and low resistance without being affected by the characteristics of environment-sensitive organic EL elements and other peripheral elements or the limitations derived from the laminated structure. Moreover, such an arrangement does not affect the characteristics of the organic EL elements and the peripheral elements.

As a result, variation in brightness due to power supply cross talk can be reduced, and large-screen, high-quality image display devices can be provided.

According to an embodiment of the electrooptic device, the second electrode is closer to the second substrate than the first electrode is; a spacer for regulating the distance between the first substrate and the second substrate is disposed on the first substrate or the second substrate such that the spacer is adjacent to the electrooptic element; and a connecting portion for supplying power from the second auxiliary wire to the second electrode is disposed on a surface of the spacer.

With this structure, the second electrode extends over the top surface of the spacer on the first substrate, the top surface opposing the second substrate; and the connecting portion to the auxiliary wire formed on the second substrate is thereby formed on this top surface. Here, the spacer is adjacent to the electrooptic element and determines the distance between the first and second substrates. Here, the term "extend" means that the second electrode is formed to be larger than the required size and extends as one layer or a combination of different materials that are electrically conductive. By providing the connecting portion to the auxiliary wire in the region adjacent to the organic EL element, the operation current of the organic El element is at most ten and several μA irrespective of how high the sheet resistance of the second electrode. Thus, the display characteristics are not adversely affected. When the sheet resistance of the second electrode does not have to be small, the thickness of the second electrode does not have to be small. In this manner, the second electrode can be made highly transparent, thereby contributing to improvements in light extraction efficiency of top emission-type organic EL devices. Moreover, since the auxiliary wire having high thermal conductivity is adjacent to the electrooptic element, heat generated in the electrooptic element can be highly effectively released from the second substrate.

In another embodiment of the electrooptic device, the electrooptic substance is not formed in a region overlapping the surface of the spacer on which the connecting portion is formed, the region lying parallel to the surface of the spacer.

According to this structure, the electrooptic substance is not formed at the top or bottom of the spacer. In general, the adhesion between the organic film, which is one form of the electrooptic substance, and the electrode or insulating film is low. If there is an interface with low adhesiveness in the spacer portion to which thermal expansion stress or mechanical stress is applied, separation easily occurs from this portion. This significantly reduces the reliability of the electrooptic device.

In contrast, in this embodiment, no electrooptic substance overlaps the spacer. Thus, the first substrate can be tightly bonded with the second substrate.

The connecting part at which the first substrate is electrically connected to the second auxiliary wire may have a metal junction or metal bridge formed therein.

According to this structure, the connecting portion between the extended portion of the second electrode and the auxiliary wire can be connected by forming a metal junction or metal bridge (conduction channel) by metal migration, supersonic joining, or field-induced colossal resistance changing effects. Thus, the bonding strength is higher than the case in which conductive adhesives are used. As a result, a connection having a resistance as low as on the mΩ order or less can be obtained.

In such an embodiment, a thin film layer containing a particular metal for promoting the formation of the metal junction or the metal bridge is formed on the second electrode in at least the connecting portion.

According to this structure, the metal junction or bridge can be formed in the connecting portion with low voltage and low energy. Thus, elements formed on the first substrate do not receive damage during the bonding. An example of the substance that promotes metal bridge is a solid electrolyte such as copper sulfate (CuS) when the auxiliary wire is composed of Cu. An example of the substance that promotes formation of the metal junction is In having a low melting point.

Preferably, in the connecting portion, the area of the second auxiliary wire opposing the second electrode is larger than the area of the second electrode opposing the second auxiliary wire.

In this manner, the area of the second auxiliary wire at the connecting portion is larger than the area of the top of the spacer. Thus, alignment during the substrate bonding process can be simplified. Moreover, even with super fine electrooptic devices, the volume of the auxiliary wire can be maintained sufficiently large, and the source of metal migration can be easily maintained.

The electrooptic element may be formed for every unit circuit formed on the first substrate; and the connecting portion may be continuous in a non-opening region of every electrooptic element.

In this manner, the auxiliary wire and the connecting portion can be formed by effectively utilizing the space between the electrooptic elements, thereby yielding a highly fine electrooptic device with high aperture ratio. In this specification, the term "non-opening region" refers to a region other than the opening region. The term "opening region" refers to a region from which light from the electrooptic element is substantially emitted or a region in which light is received.

Here, the first auxiliary line may surround the opening region of the electrooptic element corresponding to each unit circuit.

In this manner, the second auxiliary wire can be formed as a flat component surrounding the electrooptic element, thereby achieving reduction in resistance. Moreover, when the second auxiliary wire is made to have a low reflectance, the auxiliary wire can be used as a black matrix of a display device to thereby improve the contrast.

In another embodiment of the electrooptic device, the spacer includes an elastic material and has a thickness larger than the thickness of the electrooptic element.

According to this structure, since the space is thicker than the electrooptic element, the distance between the substrates can be maintained at a predetermined level even after the bonding of the substrates, and the electrooptic element does not come into contact with the second substrate. Thus, degradation of electrooptic element due to stress or damage applied from the second substrate can be prevented. Moreover, since the spacer includes the elastic material, repulsion force works during the bonding process. Thus, stable bonding is possible.

The second auxiliary wire may include a low reflection material and may have a particular planar pattern that at least partially covers a non-opening region of every unit circuit.

According to this structure, a black mask or black matrix can be economically formed by using the second auxiliary wire. As a result, high-quality images with satisfactory contrast and sharpness can be presented.

Here, the particular planar pattern of the first auxiliary line may include a fine pattern having a line width less than or equal to a minimum width of the planar pattern, and the fine pattern may divide the opening region into a plurality of segments.

In this manner, the fine lines of the second auxiliary wire being formed in the opening region and extending in the horizontal direction can contribute to suppressing the amount of in-coming light in the perpendicular direction entering into and reflecting at the opening region. Thus, the image displayed is easily recognizable even under light from the ceiling. Moreover, since transmittance of light emitted in an oblique direction with respect to the second substrate is limited, the color shift in the oblique direction can be suppressed. Moreover, the fine lines of the fist auxiliary wire formed in the opening region have a smallest possible line width. Thus, the light extraction efficiency is not significantly affected. On the other hand, the line width of the second auxiliary wire in the non-opening region is made as large as possible to reduce the wire resistance. As a result, a high-quality image with satisfactory sharpness and contrast can be displayed.

The second auxiliary wire may include at least two metals selected from the group consisting of Cr, Cu, Au, Ag, Ni, Ti, W, and Mo.

With this arrangement, when the second auxiliary wire has an underlayer composed of Cr or Ni in addition to Cu, the adhesion to the second substrate composed of glass can be increased, and the reflection of external light can be suppressed. When Mo is contained, the wire can be formed as a single layer of an alloy, thereby achieving a higher productivity. Note that the second auxiliary wire may be a single layer of an elemental metal or may include an oxide of any of these metals, Sn, Ta, solder, or the like. The second auxiliary wire preferably contains Au, Ni, Ag, or Cu in its surface since the connection to the second electrode can be satisfactorily maintained.

In another embodiment of the electrooptic device, one electrooptic element is provided for every unit circuit on the first substrate, and the second substrate has a light-scattering layer opposing the opening region of each electrooptic element.

In this manner, the light-scattering layer formed in the opening region of each electrooptic element contributes to efficient light extraction from the electrooptic element. In detail, light from the electrooptic element can be scattered with the light-scattering layer, and the amount of light component emitted in the perpendicular direction with respect to the surface of the second substrate can be increased. As a result, the light extraction efficiency of the electrooptic device can be increased to at least 2 to 3 fold compared to the case in which no light-scattering layer is formed. In this invention, the "light-scattering layer" may be formed by forming a micro photonic band in the surface of the second substrate opposing the first substrate by etching or self-assembly of polymers or by roughening the surface of the second substrate.

The light-scattering layer may include a large number of micro bubbles and/or particles having an average size from half to 10 times the emission wavelength of the electrooptic element.

In this manner, the micro bubbles and/or particles promotes total reflection and diffraction of light due to a large difference in refractive index between the transparent medium of the light-scattering layer and the micro bubbles and/or particles. Thus, the light extraction efficiency can be increased.

The thickness of the light-scattering layer is preferably smaller than the thickness of the second auxiliary wire.

In this manner, the second auxiliary wire first comes into contact with the first substrate during the process of bonding the first substrate and the second substrate. Thus, the light-scattering layer thinner than the second auxiliary wire does not come into contact with the electrooptic element. The degradation of the electrooptic element by the stresses applied from the light-scattering layer can be prevented.

The light-scattering layer may be formed into a shape of a lens.

In this manner, the light generated from the electrooptic element is focused with the lens-shaped light-scattering layer. Thus, the light extraction efficiency can be further increased.

According to another embodiment of the electrooptic device, the electrooptic element includes a plurality of electrooptic elements controlled by corresponding unit circuits formed on the first substrate, the plurality of electrooptic elements forming an effective region; and the connecting portion is arranged to surround the entire periphery of the effective region.

In this embodiment, the second electrode and the second auxiliary wire are electrically connected to each other and surround the entire periphery of the effective region. Thus, the electrical conduction between the second electrode, which serves as a common electrode, and the second auxiliary wire can be made uniform, and the space in the effective region between the first and second substrates can be tightly sealed. This structure prevents water and oxygen from entering inside the electrooptic device and thereby prevents degradation of the electrooptic element.

In another embodiment, the first substrate has a second auxiliary power terminal for supplying power to the second electrode and a second electrode wire connected to the second auxiliary power terminal, and a portion at which the second electrode is connected to the second electrode is inside the connecting portion surrounding the entire periphery of the effective region.

According to this embodiment, the connecting portion between the second electrode containing an active metal and the second electrode wire is located inside the sealing structure surrounding the effective region. Thus, undesirable substances, such as water and oxygen, can be prevented from entering the device, and the degradation of the second electrode can be prevented.

The second electrode wire preferably passes through the lower side of the space on the first substrate such that the second electrode wire is preferably connected to the second auxiliary power terminal.

With this structure, the second electrode and the second electrode wire can be electrically connected without impairing the sealing effect of the sealing structure surrounding the above-described effective region.

Alternatively, a thin film layer composed of a material chemically less active when compared to the second electrode may be provided, and the thin film layer continuously may cover the spacer in the connecting portion surrounding the effective region and at least part of the surface of the first substrate up to the connecting portion at the inner side.

In this manner, the sealing portion surrounding the effective region including the spacer surface at the outermost periphery is coated with an inactive metal or inorganic substance. Thus, a sealing structure highly resistant to corrosion and having high gas barrier properties can be obtained.

In another embodiment of the electrooptic device, a first auxiliary wire for supplying auxiliary power to at least one of the electrooptic element and the electronic element is formed at a position nearer to the first substrate than the layer in which at least one of the electrooptic element and the electronic element is formed.

In this manner, the first auxiliary wire is formed on the first substrate and under the electrooptic element, the transistor-forming layer, or the like. Thus, the power having a polarity opposite to that supplied from the second auxiliary wire is secondarily supplied to at least one of the elements from the first auxiliary wire. Thus, the resistance of the power source wire system of the entire electrooptic device can be decreased, and high-quality images can be presented in large display screens. Moreover, the light-shielding property and the heat releasing property from the first substrate of the electrooptic device can be enhanced.

In this embodiment, the second electrode may be arranged closer to the second substrate than the first electrode is, the second auxiliary wire may supply power to the second electrode, and the first auxiliary wire may supply power to the first electrode.

In this manner, power is supplied to the second electrode from the second auxiliary wire and to the first electrode form the first auxiliary wire. Thus, power can be supplied while the resistance is maintained at a low level. Thus, the power supply cross talk can be significantly suppressed. This effect is particularly notable with large-size electrooptic devices. Thus, a large electrooptic device having high and uniform brightness can be obtained.

In the embodiment having the secondary auxiliary on the first substrate, the electrooptic element may include a plurality of electrooptic elements corresponding to a plurality of unit circuits disposed on the first substrate, and the power supply wire, the second auxiliary wire, and the first auxiliary wire may extend toward the vicinity of the unit circuits by forming a planar shape.

In this manner, the resistance of the power supply wire can be reduced compared to the case in which these wires do not extend near the unit circuit. For example, the first auxiliary wire is formed over the entire effective region by forming a flat shape or a striped shape. Although the aperture ratio of the electrooptic element has been decreased by the increased width of the power supply wire in the related art, the electrooptic device of this embodiment includes power supply wire with a small width and yet achieves higher fineness.

Here, the first auxiliary wire may supply power to at least one of the electrooptic element and the electronic element by using at least one layer of a plurality of conductive films isolated from each other according to the characteristics of the electrooptic element.

In this manner, allocation of the conductive films of the first auxiliary wire is determined based on the characteristics and type of the electrooptic element. For example, one of the conductive films may be used for emitting light of a particular color in an RGB full color display, and other conductive films isolated from each other may independently supply power to the electrode. Thus, the optimum drive voltage may be set according to the color of light emission, and the ON and OFF of the power source can be freely conducted. As a result, the power consumption of the electrooptic devices whose optimum setting differs from one device to another can be effectively decreased, and an image having the optimum quality can be produced.

Here, the first auxiliary wire may include the plurality of conductive films electrically connected through contact holes in the insulating films.

In this embodiment, the resistance of the substantial cross-sectional area of the first auxiliary wire can be further decreased when compared with the case in which the first auxiliary wire is formed as a single layer. Moreover, redundancy of the auxiliary wire can be increased, and a wire structure highly resistant to breaking can be obtained.

In this embodiment, the first auxiliary wire preferably has a slit in a region overlapping the spacer.

With this structure, the stress applied to the first auxiliary wire can be absorbed and reduced by the slit during the process of bonding the first substrate and the second substrate. Since a larger stress is applied onto the region overlapping the spacer, short-circuiting of the conductive film or microcracks or breaking of the insulating film easily occur when the conductive film pattern is deformed. The slit can effectively reduce the stress and prevents microcracks or breaking of the films and warpage of the substrate, for example.

A method for making an electrooptic device including a first substrate and a second substrate includes a first substrate forming process of forming, on the first substrate, an electrooptic element, which has a first electrode, a second electrode, and an electrooptic substance interposed between the first and second electrodes; an electronic element for driving the electrooptic element; and a power supply wire for supplying power to at least one of the electrooptic element and the electronic element; a second substrate forming process of forming a second auxiliary wire for supplying auxiliary power to at least one of the electrooptic element and the electronic element, the second auxiliary wire being disposed on a surface of the second substrate that opposes the first substrate, the second auxiliary wire having a planar shape that corresponds with a non-opening region of the electrooptic element; and a bonding process of bonding and sealing the first substrate and the second substrate so that the second auxiliary wire can supply power to the first substrate.

According to this method, the first substrate forming process is independent from the second substrate forming process. Thus, formation of an auxiliary wire having a low resistance and patterning into a complicated shape are possible. Since the conditions of the second substrate forming process do not affect the characteristics of the element on the first substrate, a larger degree of freedom is given to the production method. Thus, an electrooptic device with high quality and high productivity can be made.

In one embodiment of this method, the first substrate forming process includes forming on the first substrate a spacer for regulating the distance between the first substrate and the second substrate such that the spacer is adjacent to the electrooptic element, forming, on a surface of the spacer, a connecting portion for supplying power from the second auxiliary wire to the second electrode, and preventing the formation of the electrooptic substance in a region overlapping the surface of the spacer on which the connecting portion is formed, the region lying parallel to the surface of the spacer.

According to this method, no organic electrooptic substance having low adhesiveness is provided in the region overlapping the spacer. Thus, damage and adverse effect onto the electrooptic element portion during the bonding can be avoided, and an electrooptic device with high connection reliability can be made.

The bonding process may include bringing the second electrode and the second auxiliary wire into close contact in the connecting portion under a reduced pressure; arranging the connecting portion to surround an effective region including a plurality of electrooptic elements controlled by the unit circuits formed on the first substrate and forming a metal junction in the connecting portion located at the outermost periphery; and sealing at least the outer portion of the connecting portion located at the outermost periphery with a sealant.

According to this method, impurity gas or particles adhering/entering the sealant or the components on the substrate can be prevented from remaining inside the electrooptic device. Moreover, since the outermost periphery of the connecting part is metal-joined to achieve high airtightness and strong bonding, the interior of the electrooptic device can be maintained at a negative pressure for a long period of time, thereby stabilizing the junction in the connecting portion inside the effective region. Moreover, the metal joint at the connecting portion of the outermost periphery increases the uniformity of conduction in the auxiliary wire, and highly uniform photoelectric conversion becomes possible.

In another embodiment of this method, the bonding process includes applying a predetermined voltage between the second electrode and the second auxiliary wire so as to form a metal bridge (conduction channel) in the connecting portion by metal migration or field-induced colossal resistance change such that the second electrode and the second auxiliary wire are electrically conducted.

In this embodiment, the conduction between the second electrode and the second auxiliary wire is stronger and securer when compared to the method in which these components are simply press-bonded or bonded with an adhesive containing conductive particles. Moreover, since there is no need to apply an adhesive, overflow of conductive particles in the adhesive to the effective display region of the electrooptic element, which may be a problem in forming a finer connection, can be avoided. The production stability is also increased. Moreover, even when the metal bridge and the electrical connection is destroyed after the completion of the production of the electrooptic device, the metal bridge can be recovered by again allowing the metal migration to occur by applying a voltage to the connecting portion.

Moreover, when the connecting part formed by metal migration or field-induced colossal resistance change is used as a regulator circuit for regulating the functions or characteristics of the electrooptic device, programmable functions can be simultaneously mounted onto the electrooptic device during the production.

An electronic apparatus incorporating the electrooptic device of any of the above-described embodiments is also provided.

The electronic apparatus includes the electrooptic device that can display high-quality images and may be applied to devices with displays, such as television sets, cellular phones, gaming machines, electronic notebooks, viewers, workstations, personal computers, picture telephones, POS terminals, programmable controllers, and touch panels; and image-forming apparatuses, such as printers, copiers, facsimile machines, electronic paper writers incorporating electrooptic devices serving as exposure heads.

The invention can also be applied to solid spontaneous light-emitting elements such as silicon light-emitting devices, ballistic electron-emitting elements (BSDs), light-emitting diodes (LEDs), and the like; and electrooptic apparatuses incorporating organic or inorganic semiconductor photoelectric conversion elements in addition to the organic EL devices.

Other effects and advantages of the invention will eventually become apparent from the detailed description of the invention below.

DESCRIPTION OF EXEMPLARY EMBODIMENTS

The exemplary embodiments of the present invention will now be described with reference to the drawings. In the embodiments below, an organic EL device of a TFT active matrix drive type is described as an example of the electrooptic device.

First Embodiment

The overall structure of the organic EL device of a first embodiment and the structure of the pixel unit are first described with reference to FIGS. 1 to 10.

Overall Structure of Organic EL Device

Figure 1:
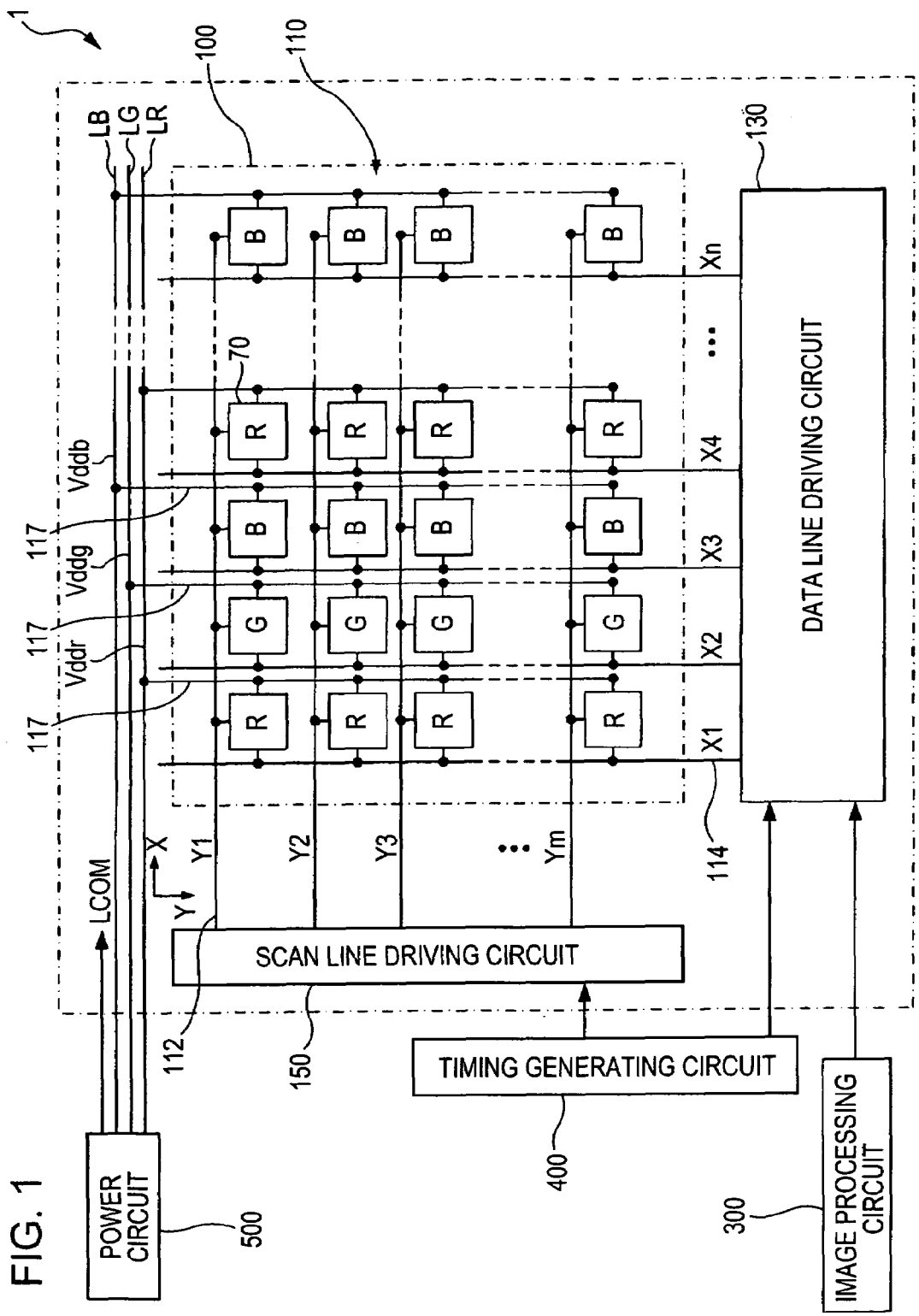
FIG. 1 is a block diagram showing the overall structure of the organic EL device of a first embodiment.
Figure 2:
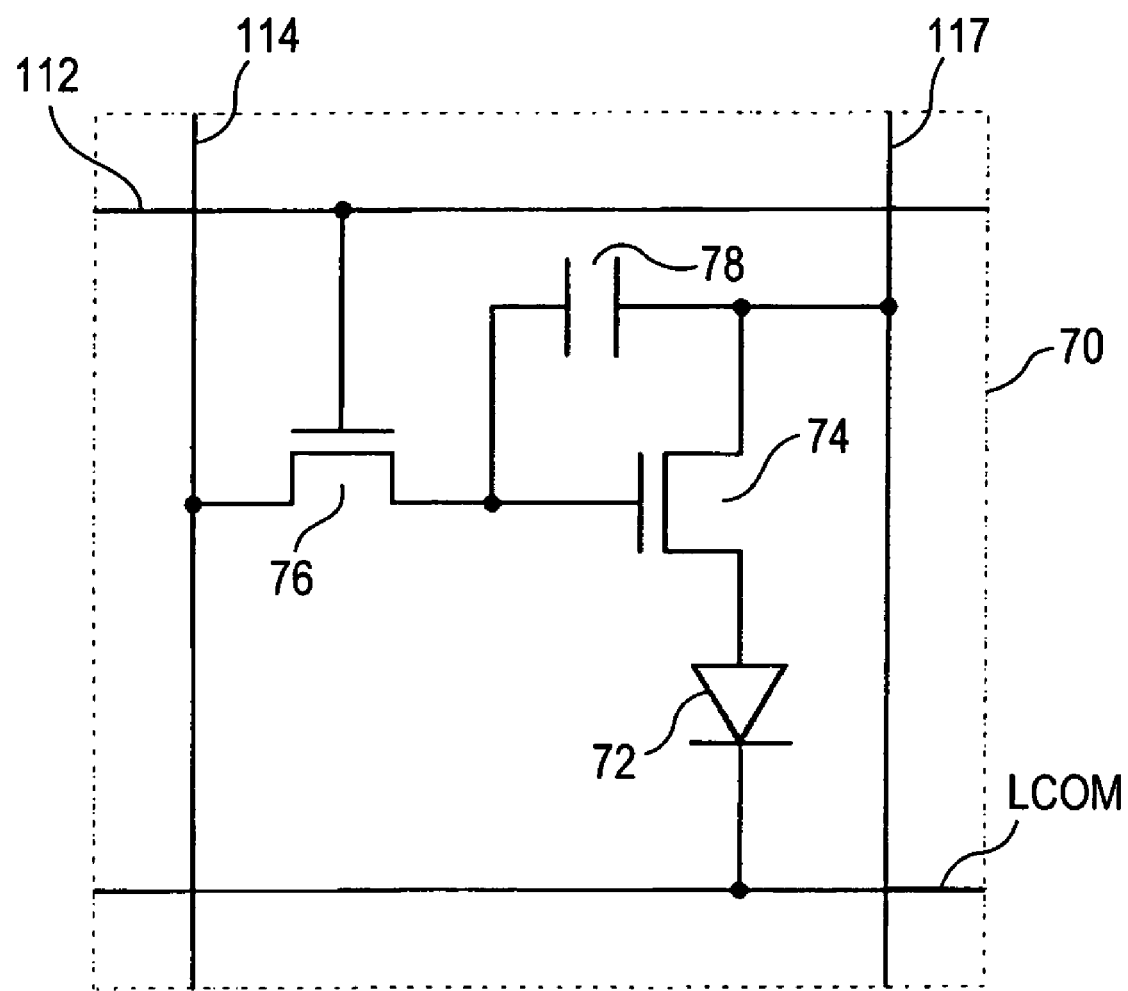
FIG. 2 is a block diagram showing the structure of a particular pixel unit of the first embodiment.

FIG. 1 is a block diagram showing the overall structure of the organic-EL device of this embodiment. FIG. 2 is a circuit diagram showing the structure of a particular pixel unit.

In FIG. 1, an organic EL device 1, which is an example of the electrooptic device, has an organic EL panel 100, a power circuit 500, a scan line driving circuit 150, a data line driving circuit 130, an image processing circuit 300, and a timing generating circuit 400 as the main components.

The organic EL panel 100 has the number m (wherein m is a natural number of 2 or more) of scan lines 112 arranged in parallel to the X direction and the number n (wherein n is a natural number of 2 or more) of data lines 114 arranged in parallel to the Y direction orthogonal to the X direction. The scan lines 112 and the data lines 114 are disposed in a image display region 110 occupying the center of the element substrate of the organic EL panel 100. Each pixel unit 70 is disposed at the position corresponding to the intersection of these lines, thereby forming a matrix. The pixel unit 70 includes an organic EL element. In FIG. 1, the symbols "R (red)", "G (green)", and "B (blue)" show the color of light emitted from the corresponding organic EL elements. In this embodiment, pixel units 70 of a particular color are arranged along the data line 114. Of the pixel units 70, those for emitting red light are connected to a main power line LR via a power supply line 117, those for emitting green light are connected to a main power line LG via another power supply line 117, and those for emitting blue light are connected to a main power line LB via another power supply line 117.

The power circuit 500 generates power voltages Vddr, Vddg, and Vddb which are respectively applied to the red, green and blue pixel units 70 through the main power lines LR, LG, and LB via the power supply lines 117.

The scan line driving circuit 150 and the data line driving circuit 130 are disposed in the peripheral region around the image display region 110. The scan line driving circuit 150 supplies a scan signal for each line of pixel units 70 arranged in matrix via the scan line 112. The data line driving circuit 130 sequentially supplies image signals supplied from the data line driving circuit 130 to the respective data lines 114.

When an input image data is input to the image processing circuit 300 from an external source, an image signal is generated based on the input image data. The image signal is output to the data line driving circuit 130, latched or sampled in a latch circuit or the like in the data line driving circuit 130, and supplied to the organic EL panel 100.

The timing generating circuit 400 generates various timing signals used in the respective sections of the organic EL panel 100. The timing signals are output to the data line driving circuit 130 and the scan line driving circuit 150.

Referring now to FIG. 2, a particular pixel unit 70 includes an organic EL element 72 serving as a display element, a driving transistor 74 for supplying a driving current to the organic EL element 72, and a switching transistor 76 for selectively inputting an image signal for controlling the operation of the driving transistor 74 through the data line 114.

The source electrode of the switching transistor 76 is electrically coupled to the data line 114 to which an image signal is fed from the data line driving circuit 130. The gate electrode of the switching transistor 76 is electrically connected to the scan line 112 for supplying a scan signal described below. The drain electrode of the switching transistor 76 is connected to a hold capacitor 78.

The scan line 112 is electrically connected to the gate electrode of the switching transistor 76, and the data line 114 is electrically connected to the source electrode of the switching transistor 76. The power supply line 117 is connected to the source electrode of the driving transistor 74 and to the hold capacitor 78.

The source electrode of the driving transistor 74 is electrically connected to the power supply line 117. Since the operation of the driving transistor 74 is controlled by the voltage applied to the gate electrode of the driving transistor 74, the driving transistor 74 supplies a driving current from the power supply line 117 to the organic EL element 72.

Note that it is possible to employ various structures, in which a plurality of, e.g., four, TFTs, a plurality of capacitors, and the like components are included, instead of the structures of the pixel circuit exemplarily shown in FIGS. 1 and 2. For example, a pixel electrode of a current-program type, a pixel circuit of a voltage-program type, a pixel circuit of a voltage comparator type, or a pixel circuit of a sub-frame type can be employed.

Structure of Pixel Unit

Figure 3:
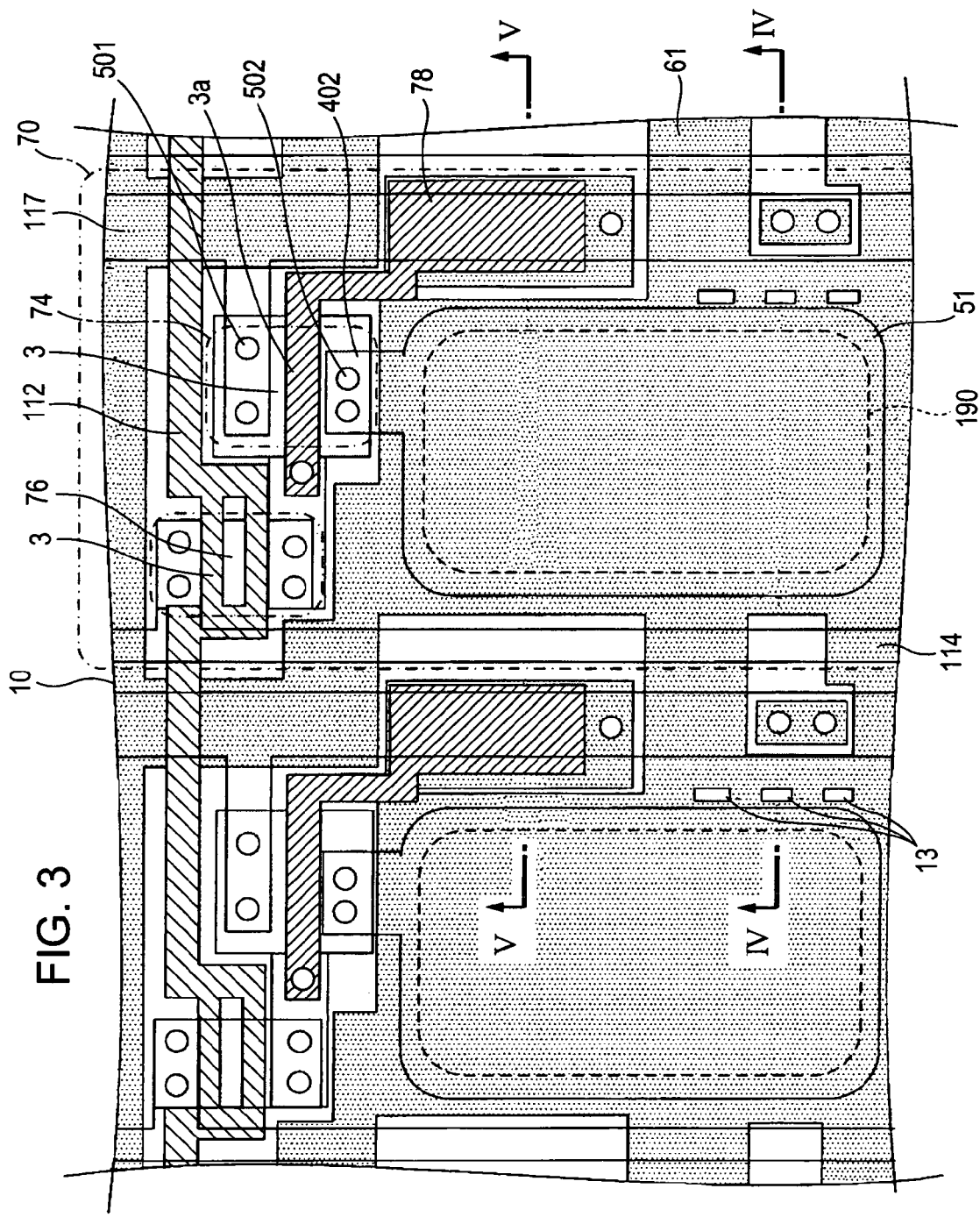
FIG. 3 is a plan view of two adjacent pixel units of the first embodiment.
Figure 4:
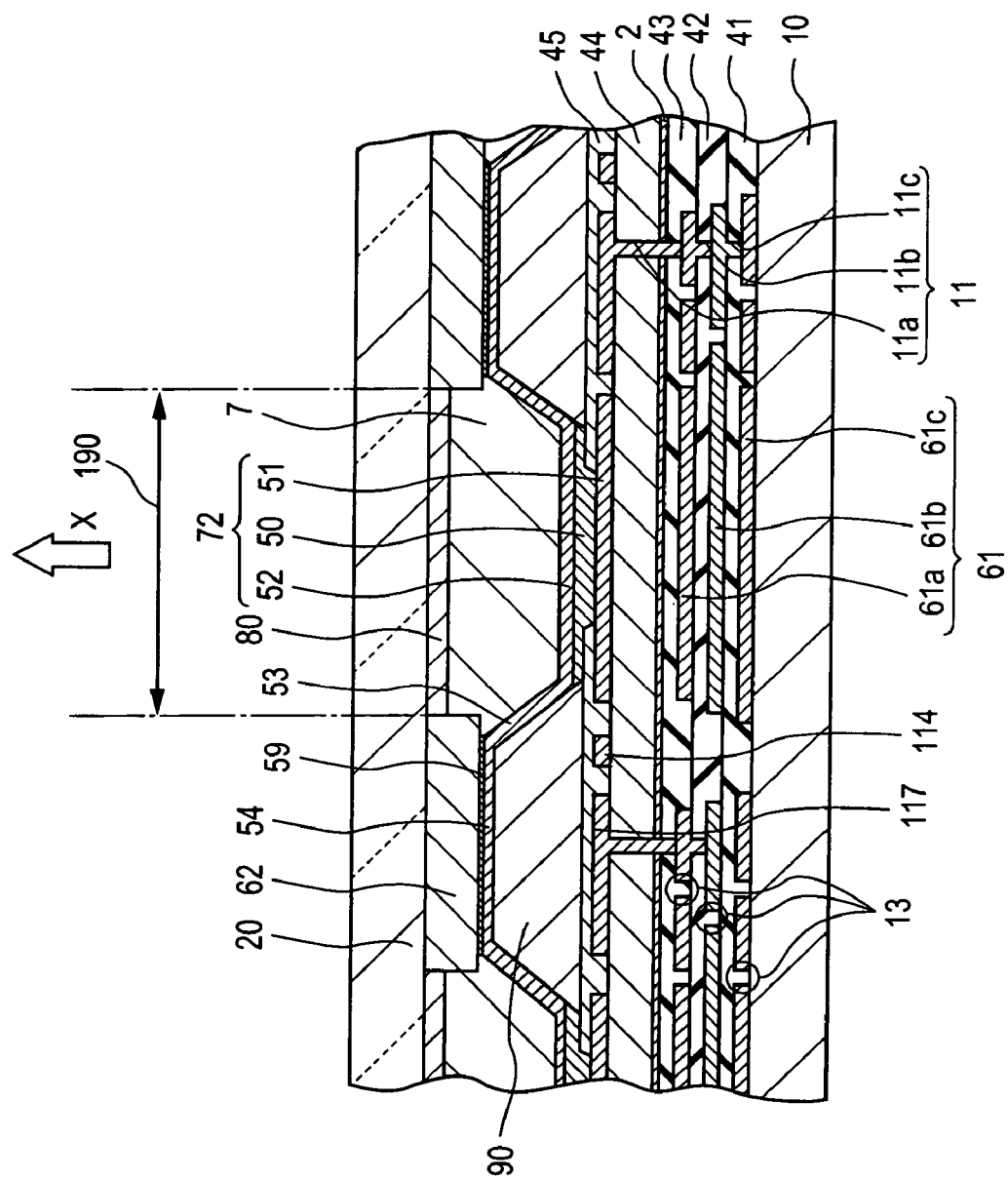
FIG. 4 is a cross-sectional view taken along line IV-IV in FIG. 3.
Figure 5:
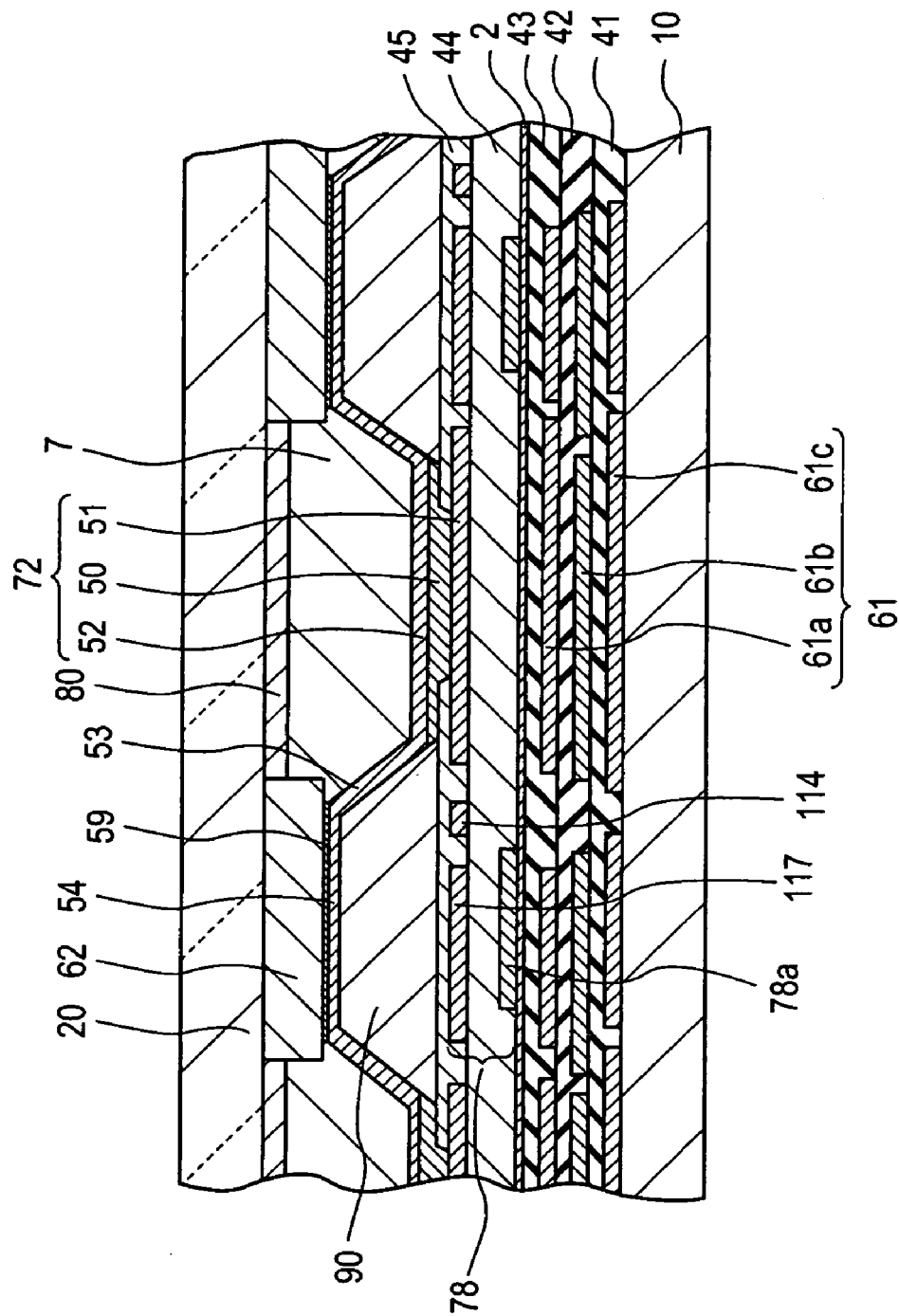
FIG. 5 is a cross-sectional view taken along line V-V in FIG. 3.
Figure 6:
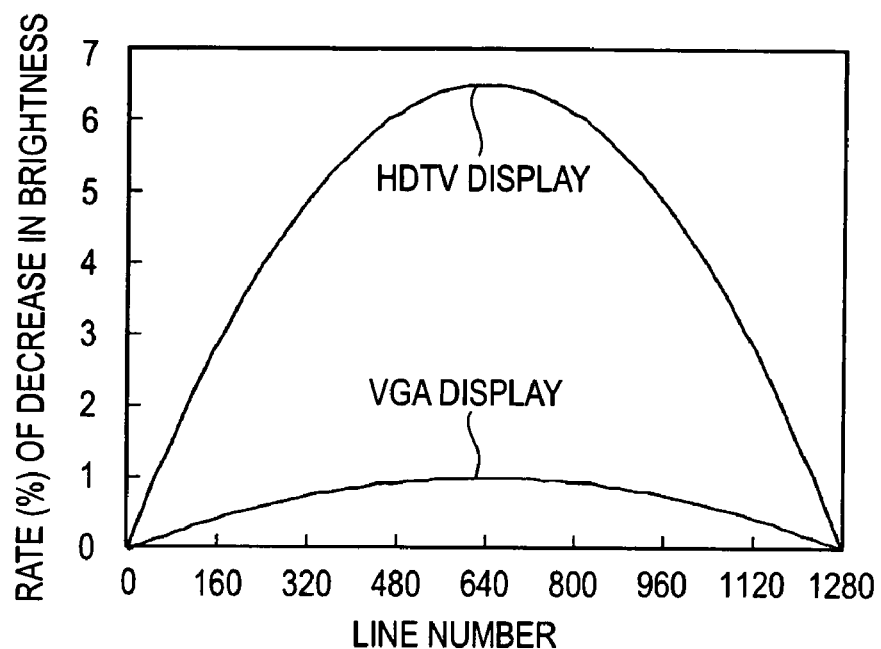
FIG. 6 is a graph showing the rate of decrease in brightness.
Figure 7:
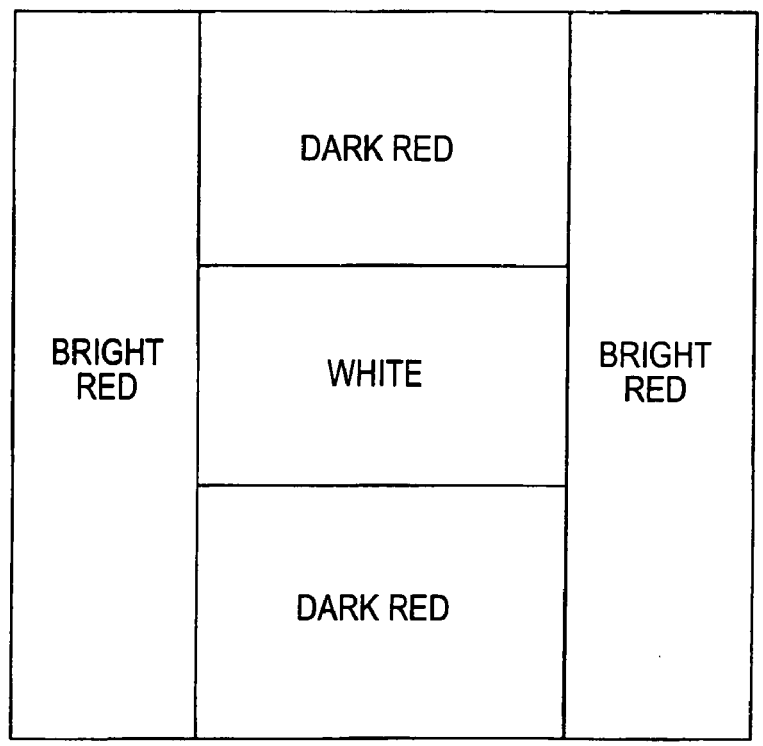
FIG. 7 is a schematic plan view showing an in-plane distribution of the brightness in an image display region.

The pixel unit will now be described in further details with reference to FIGS. 3, 4, and 5. FIG. 3 is a plan view of two adjacent pixel units, FIG. 4 is a cross-sectional view taken along line IV-IV in FIG. 3, and FIG. 5 is a cross-sectional view taken along line V-V in FIG. 3. Note that in FIGS. 3, 4, and 5, the respective layers and components are depicted in different scales so that they are sufficiently identifiable in the drawings.

As shown in FIG. 4, in this embodiment, the space between a first substrate 10 and a second substrate 20 is regulated by the thicknesses of a spacer 90 and a second auxiliary wire 62.

An auxiliary wire 61, i.e., first auxiliary wires 61a, 61b, and 61c, and interlayer insulating films 41, 42, 43 are alternately stacked on the first substrate 10. The conductive films respectively constituting the first auxiliary wires 61a, 61b, and 61c are electrically connected to the power supply line 117 via a contact hole 11c and/or a contact hole 11b. A transistor-forming layer 44, in which the switching transistor 76 and the driving transistor 74 are formed, is disposed on a metal contamination preventing layer 2. The transistor-forming layer 44 is produced by, for example, a low-temperature polysilicon technique.

Preferably, the first auxiliary wires 61 composed of at least one metal selected from W, Mo, Ta, Ti, Ni, Al, and Cu, a heavily doped polysilicon, or an organic semiconductor are stacked on the first substrate 10, the sheet resistance is $0.3\Omega/\square$ or less, and the thickness is 200 to 300 nm.

Referring now to FIG. 3, a portion of the scan line 112 is formed to function as a gate electrode 3 of the switching transistor 76. The gate electrode 3 and the scan line 112 are composed of a metal material including at least one of aluminum (Al), tungsten (W), tantalum (Ta), molybdenum (Mo), titanium (Ti), copper (Cu), and the like.

As shown in FIG. 4, the data line 114, the power supply line 117, and a first electrode 51 connected to a drain electrode 402 (see FIG. 3) of the driving transistor 74 (see FIG. 3) are disposed on the transistor-forming layer 44 whose surface layer is an interlayer insulating-film. The data line 114, the power supply line 117, and the first electrode 51 are composed of a conductive material including, for example, aluminum (Al), tantalum (Ta), molybdenum (Mo) or indium tin oxide (ITO). In the transistor-forming layer 44, contact holes 501 and 502 are formed. The contact holes 501 and 502 extend from the surface of the transistor-forming layer 44 to the source and the drain of the driving transistor 74 in the transistor-forming layer 44. The conductive films constituting the power supply line 117 and the drain electrode 402 (see FIG. 3) are continuously formed along the inner walls of the contact holes 501 and 502 toward the surface of the transistor-forming layer 44.

A protective layer 45 composed of, for example, silicon dioxide ($SiO_2$) is disposed over the transistor-forming layer 44 so as to cover the data line 114, the power supply line 117, and the first electrode 51 integrally combined with the drain electrode 402 (see FIG. 3).

The spacer 90 composed of, for example, a resin based on acryl, polyimide, or cyclic olefin, or a shape-memory alloy is formed on the protective layer 45. The spacer 90 defines the region for forming an organic EL layer 50 in the pixel unit 70.

The first electrode 51 is formed on the transistor-forming layer 44 and in the region for forming the organic EL layer 50, thereby exposing the surface of the first electrode 51. The first electrode 51 is extended beyond the region for forming the organic EL layer 50 and formed to function s the drain electrode 402 (refer to FIG. 3) of the driving transistor 74 (refer to FIG. 3).

In the region for forming the organic EL layer 50, the organic EL layer 50 is formed on the first electrode 51. The organic EL layer 50 includes, for example, an emission layer, a hole injection or transport layer (hereinafter, referred to as "hole injection/transport layer"), an electron injection or transport layer (hereinafter referred to as "electron injection/transport layer"), and an emission protective layer. In the organic EL layer 50, a hole injection/transport layer, a first emission protective layer, an emission layer, a second emission protective layer, and an electron injection/transport layer are sequentially stacked in that order on the first substrate 10. However, the organic EL layer 50 may have any layer structure known in the art.

The organic EL element 72 has the first electrode 51, a second electrode 52, and the organic EL layer 50 interposed between the first electrode 51 and the second electrode 52. The second electrode 52 is a combination of a cesium carbonate film and an MgAg film or a multilayer film of transparent conductive films such as ITO films, In—Zn—O (IZO) films, and the like. The second electrode 52 may be a multilayer film having a thickness of about 10 nm composed of Au, Ni, Ag, Cu, Pt, Si, an alloy thereof, or a compound thereof instead of or in addition to the ITO films, IZO films, and the like.

Referring now to FIG. 5, a lower electrode 78a of the hold capacitor 78 is formed in the same layer as the scan line 112 and is composed of the same material as the scan line 112, for example. A portion of the power supply line 117 is made to function as an upper electrode of the hold capacitor 78. The insulating film in the transistor-forming layer 44 is used as a dielectric film. The insulating film in the transistor-forming layer 44 is interposed between the lower electrode and the upper electrode. The hold capacitor may be increased by interposing the lower electrode between the upper electrode and the first auxiliary wire 61a serving as the counter electrode.

As shown in FIG. 4, in this embodiment, the second electrode 52 is provided over the surface of the spacer 90, thereby forming second electrode extended portions 53 and 54. The second electrode extended portions 53 are disposed on the inclined surfaces of the spacer 90 and the second electrode extended portions 54 are disposed at the flat top surfaces of the spacer 90. A thin film 59 containing at least one metal having relatively high resistance to oxidation, such as Au, Ag, Cu, Ti, Ni, or Al, is formed on the second electrode extended portion 54 by mask deposition.

The second auxiliary wire 62 is formed on the surface of the second substrate 20 at the side opposing the first substrate 10. The first substrate 10 and the second substrate 20 are bonded with a conductive or insulating adhesive so that the second electrode extended portion 54 comes into contact with the second auxiliary wire 62, thereby ensuring electrical conduction. By vacuum-sealing a space 7 of the pixel unit, the above-described state of contact can be stably maintained by the ambient pressure. As described below, metal bonding by metal migration or ultrasonic waves requiring no adhesives is preferably conducted alternatively or in addition.

During the operation of the organic EL device 1 of this embodiment, a scan signal is supplied through the scan line 112 to turn on the switching transistor 76. Once the switching transistor 76 is turned on, an image signal is written in the hold capacitor 78 through the data line 114. In accordance with the current of the image signal written in the hold capacitor 78, the power is supplied to the driving transistor 74 through the power supply line 117. The current corresponding to the image signal is then fed from the driving transistor 74 to the organic EL element 72, and the emission layer of the organic EL element 72 thereby emit light. Since the power is auxiliary supplied through the second auxiliary wire 62, it is possible to supply enough power despite high sheet resistances of the second electrode 52, the power supply line 117, and other associated components. In this embodiment, as shown by arrow X in FIG. 4, the organic EL device 1 is of a top emission type in which light is emitted from the organic EL element 72 toward the second substrate 20-side. Alternatively, the organic EL device 1 may be of a bottom emission type in which the light emitted from the organic EL element 72 is emitted as display light from the first substrate 10.

First Auxiliary Wire

The first auxiliary wires 61 will now be described in detail with reference to FIGS. 3 to 5.

The first auxiliary wires 61 are arranged to extend in the image display region 110. In particular, the first auxiliary wires 61 extend across substantially the entire image display region 110 other than the pixel openings and have a planar shape corresponding to the pixels. Thus, the area of the first auxiliary wires 61 required for decreasing the resistance at the first electrode 51-side can be increased, and it becomes possible to effectively reduce the resistances of the power supply line 117 and the first electrode 51 compared to the case in which only the power supply lines are provided. The first auxiliary wires 61 are not formed in the regions that oppose the regions in which the switching transistors 76 and the driving transistors 74 are formed. In this manner, the electronic elements such as the switching transistors 76 and the driving transistors 74 are prevented from degradation in electrical properties since the parasitic capacity in the first auxiliary wires 61 is eliminated.

As shown in FIG. 4, the conductive films 61a, 61b, and 61c of the first auxiliary wire 61 are connected to each other and independently to the power supply line 117 through the contact holes 11a, 11b, and 11c in the interlayer insulating films 41, 42, and 43.

In this manner, the conductive films 61a, 61b, and 61c connected to each other through the contact holes 11a, 11b, and 11c in the interlayer insulating films can be used as a single auxiliary wire having a large size. Thus, in comparison with the case where only a single-layer film is provided, the substantial cross-sectional area can be significantly increased and the resistance of the power supply line 117 can be further decreased. In addition, the redundancy of the first auxiliary wire 61 can be increased, and thus a wire structure highly resistant to line breaking can be obtained.

As shown in FIGS. 3 and 4, the first auxiliary wire 61 has overlapping portions overlapping the spacers 90 in a plan view from the first substrate 10. In these overlapping portions, slits 13 are formed.

By this arrangement, the stress applied to the first auxiliary wire 61 and generated by the bonding of the first substrate 10 and the second substrate 20, thermal expansion, or the like can be reduced by the slits 13 in the region where wires are provided. In particular, a large stress is applied to the regions overlapping the spacer 90. This arrangement prevents deformation of the first auxiliary wire 61 in the lower portions of the spacers 90 by the stress and occurrence micro cracks, short-circuiting between wires, warpage of substrates, and the like.

Second Auxiliary Wire

The second auxiliary wire 62 will now be described in detail with reference to FIGS. 3 to 7.

As shown in FIGS. 4 and 5, the second electrode 52 is disposed closer to the second substrate 20 than the first electrode 51 is and extend over the surfaces of the spacers 90 opposing the second substrate 20. In other words, in this embodiment, a conductive film is disposed on the surfaces of the spacers 90 opposing the second substrate 20, and the second auxiliary wire 62 auxiliary supplies power via this conductive film. Thus, when the first substrate 10 is bonded with the second substrate 20 with an adhesive or the like such that the spacers 90 oppose the second auxiliary wire 62, the second auxiliary wire 62 becomes electrically connected to the second electrode extended portions 54, thereby decreasing the resistance of the second electrode 52. The adhesive is, for example, a photocurable adhesive mainly composed of at least one resin selected from. epoxy, phenol, and cyanate resins, or a thermosetting adhesive mainly composed of at least one selected from acrylate compounds, epoxy resins, and oxetane compounds.

The organic EL layer 50 is interposed between the first electrode 51 and the portion of the second electrode 52 other than the second electrode extended portions 53 and 54. According to this structure, no organic EL layer 50 is provided in the region under the spacer 90 where the stress in the direction from the second substrate 20 toward the first substrate 10 is applied. Since the adhesiveness between the electron-emitting apparatus 40 and adjacent layers is low, the interfaces with the organic EL layer 50 become easily detached by the mechanical and/or thermal stresses generated during the bonding operation. This is a factor that significantly decreases the reliability of the organic EL devices.

In contrast, in the present invention, the interface with the organic EL layer 50 is not formed in the spacer 90 where the stress is mostly applied. Thus, this embodiment is free from such a problem, and a highly reliable organic EL device can be provided.

As shown in FIGS. 3 to 5, the second auxiliary wire 62 surrounds an opening region 190 in the pixel unit 70 (refer to FIG. 4), and the second electrode extended portion 54 is connected to the second auxiliary wire 62 on the spacer 90, which is the non-opening region provided for every pixel unit 70. In this manner, the second auxiliary wire 62 does not adversely affect the transmission of the light emitted from the opening region 190, and the resistances of the power supply line 117 and the second electrode 52 can be decreased while retaining the aperture ratio.

Spacer

The spacer 90 will now be described in detail with reference to FIGS. 4 and 5.

The spacer 90 is disposed on the first substrate 10 and includes an elastic, rigid, or shape-memory member having a thickness larger than the organic EL element 72.

Since the spacer 90 has a thickness larger than the organic EL element 72, a predetermined gap is defined by the spacer 90 when the first substrate 10 is bonded with the second substrate 20. The size of the gap can be easily adjusted by changing the thickness of the spacer 90. Moreover, since the organic EL element 72 does not come into contact with the second substrate 20, no stress or damage occurs to the organic EL element 72 in bonding the first substrate 10 with the second substrate 20. Thus, the degradation of the organic EL element 72 by stress can be prevented. Since the spacer 90 includes an elastic member, repulsion force is generated during the bonding. This ensures secure connection between the second electrode extended portion 54 and the second auxiliary wire 62.

Light-Scattering Layer

A light-scattering layer 80 will now be described in detail with reference to FIGS. 4 and 5.

In FIGS. 4 and 5 and in this embodiment, the light-scattering layer 80 is formed on the second substrate 20 in the opening region 190 of the pixel unit 70. With the light-scattering layer 80, light emitted from the organic EL element 72 in the pixel unit 70 can be efficiently extracted. In other words, the light generated in the organic EL element 72 can be scattered with the light-scattering layer 80, and light components incident on the surface of the second substrate 20 at an angle equal to or less than the total reflection angle can be increased. In this manner, the extraction efficiency of the light generated from the organic EL element 72 toward the outside of the organic EL device 1 can be increased to at least two to three fold compared to the case where no light-scattering layer 80 is provided.

The thickness of the light-scattering layer 80 is smaller than the thickness of the second auxiliary wire 62. Thus, when the first substrate 10 is bonded to the second substrate 20, the second auxiliary wire 62 comes into contact with the first substrate 10 to provide a support. Thus, the light-scattering layer 80 having a thickness smaller than the second auxiliary wire 62 does not com into contact with the organic EL element 72. Accordingly, the degradation of the organic EL element 72 resulting from the stresses applied from the light-scattering layer 80 can be prevented.

(Process for Making Second Auxiliary Wire and Light Scattering Layer)

The process for making the second auxiliary wire 62 and the light-scattering layer 80 on the second substrate 20 will now be described in detail with reference to FIGS. 8A to 8E. FIGS. 8A to 8E show the multilayer structure on the second substrate 20 during the process of making the second auxiliary wire 62 and the light-scattering layer 80.

Figure 8A:
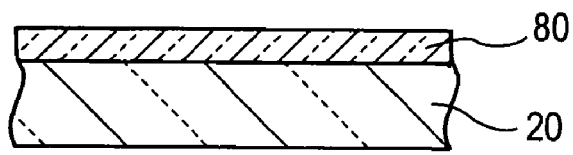
FIGS. 8A to 8E are step diagrams sequentially showing a laminated structure on a second substrate.

First, in the step shown in FIG. 8A, the light-scattering layer 80 is formed on the entire surface of the second substrate 20 by using a resin, such as PET, PEN, or cyclic olefin, of an inorganic material, such as glass, having a high visible light transmittance. In order to form the light-scattering layer 80 with a resin, a thermosetting or photocurable transparent resin is applied on the second substrate 20 in a dry inert gas atmosphere and then cured by application of light or heat. In this embodiment, the second substrate 20 is put under a suitable vacuum before curing by the application of light or heat. In this manner, micro bubbles of several micrometers or less are generated in the light-scattering layer 80. By subsequently conducting curing by application of light or heat, a light-scattering layer including many micro bubbles is made. Thus, a light-scattering layer 80 achieving higher light extraction efficiency from the organic EL element 72 compared to the case in which curing is conducted by directly applying light or heat can be obtained.

Alternatively, the light-scattering layer 80 may be formed by dispersing a large number of microparticles in a transparent medium instead of or in addition to using micro bubbles. The microparticles are preferably composed of a high refractive index, porous, visible light-transmitting material having an average particle diameter of several micrometers to 200 nm at which light is easily totally reflected. Alternatively, the microparticles may be metal microparticles. Examples of the high refractive index, porous, visible light-transmitting material include those mainly composed of $SiO_2$, magnesium fluoride ($MgF_2$), alumina ($Al_2O_3$), $Y_2O_3$, $CeF_3$, SiO, or barium titanate, or hollow polymers. Examples of the process for making the microparticles or the transparent porous layer include a metal anode oxidation process, a cathode deposition process, a screen-printing process, a sol gel process, a thermal oxidation process, a vacuum deposition process, DC and Rf sputtering processes, a chemical vapor phase deposition process, and a molecular beam deposition process.

The light-scattering layer 80 may be formed by etching the surface of the second substrate 20 opposing the first substrate 10 so as to form irregularities on the surface or may be formed by simply roughening the surface.

Figure 8B:
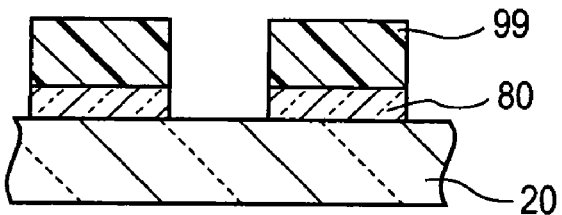

In the subsequent step shown in FIG. 8B, the light-scattering layer 80 is patterned. In detail, a resist 99 us applied on the light-scattering layer 80, and a pattern is formed by photolithography. The light-scattering layer 80 is etched with a solvent to prepare the light-scattering layer 80 having a predetermined pattern.

In this embodiment, the light-scattering layer 80 is patterned to match with the shape of the opening region 190 of the pixel unit 70.

Figure 8C:
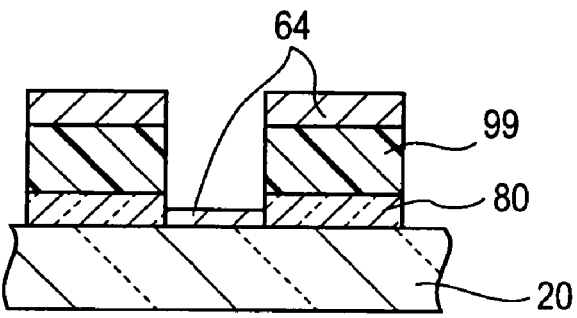

In the step shown in FIG. 8C, a Cr thin film 64 is formed on the exposed portion of the second substrate 20 and on the resist 99 by vacuum deposition or sputtering. By forming the Cr thin film 64, the adhesion between the second substrate 20 made of glass and the second auxiliary wire 62 made of Cu can be increased, and the reflection of external light can be suppressed. The thin film 64 may be made of elemental Ni or Cr, or a compound including Ni or Cu instead of Cr.

Figure 8D:
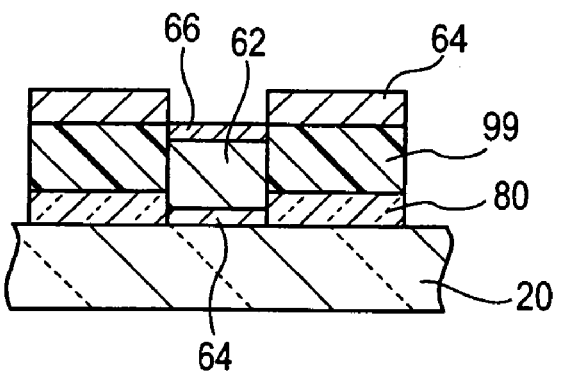

In the step shown in FIG. 8D, a copper film having a thickness of 5 to 20 µm is deposited on the Cr thin film 64 by, for example, electrolytic plating, screen printing, or injection so as to form the second auxiliary wire 62. The second substrate 20 is then heated at 300° C. to 450° C. to form a copper sulfide film 66 on the surface of the Cu film.

The second auxiliary wire 62 may include at least two metals selected from Cr, Cu, Au, Ag, Ni, Ti, W, and Mo. The second auxiliary wire 62 may be a laminate including layers composed of an elemental metal or a compound such s an oxide of any of these metals. When the second auxiliary wire 62 contains Au, Ni, Ag, or Cu, the contact with the second electrode 52 can be satisfactorily maintained. These metals are not essential component; and the second auxiliary wire 62 may contain Sn, Ta, or the like.

Figure 8E:
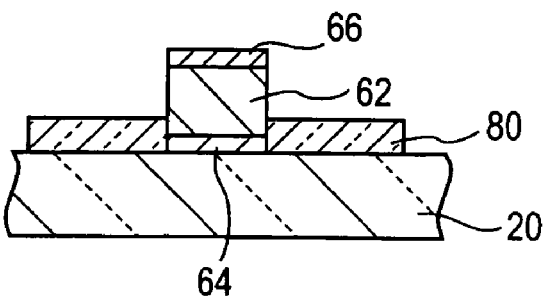

In the step shown in FIG. 8E, the resist 99 is removed, and the remaining structure is heated and dried under vacuum.

As has been previously described, the second auxiliary wire 62 is formed on the second substrate 20 independently from the first substrate 10. Therefore, it becomes possible to form the second auxiliary wire 62 without being affected by the restricting conditions derived from the planar structure and the multilayer structure of the organic EL element 72 and the peripheral regions thereof. Moreover, the second auxiliary wire 62 can be formed without affecting the planar structure and the multilayer structure of the organic EL element 72 and the peripheral regions thereof. For example, it is no longer necessary to take into account the damage on the organic EL element 72 by heat, UV rays, the etchant, chlorine or oxygen gas during the etching, high-energy sputtering particles, and the like. Thus, the limitation on the method for forming the second auxiliary wire 62 is fewer than when the second auxiliary wire 62 is formed on the first substrate 10, and the second auxiliary wire 62 can be formed by the optimum method.

By the above-described arrangement, the resistance and the thickness of the second electrode 52 can be further decreased compared to the case where the auxiliary wire is formed on the second electrode 52 on the first substrate 10. As a result, the variation in brightness in the image display region 110 can be reduced, and the high-quality image can be displayed.

Sealing Structure

Figure 9:
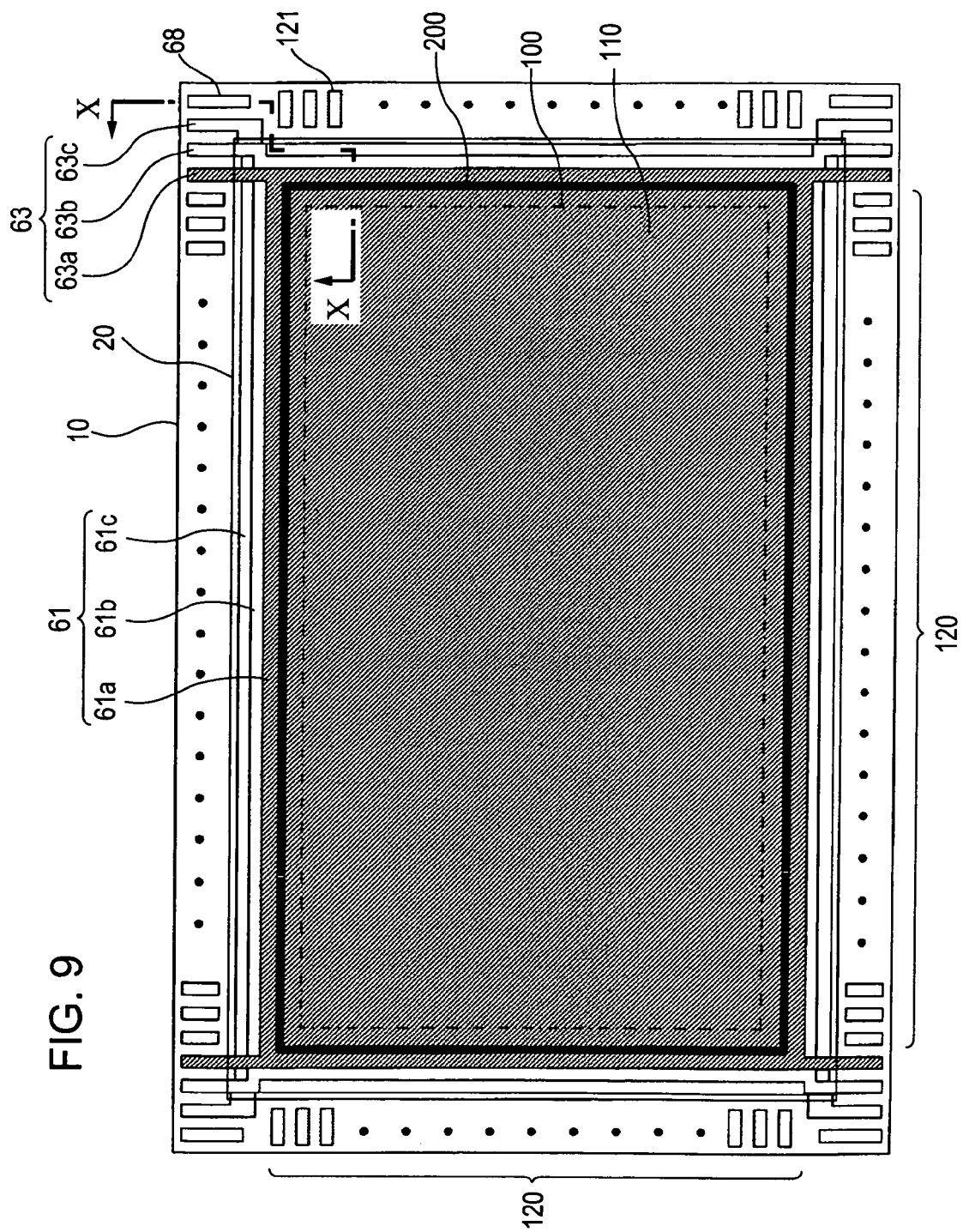
FIG. 9 is a plan view showing an arrangement of terminals according to the first embodiment.
Figure 10:
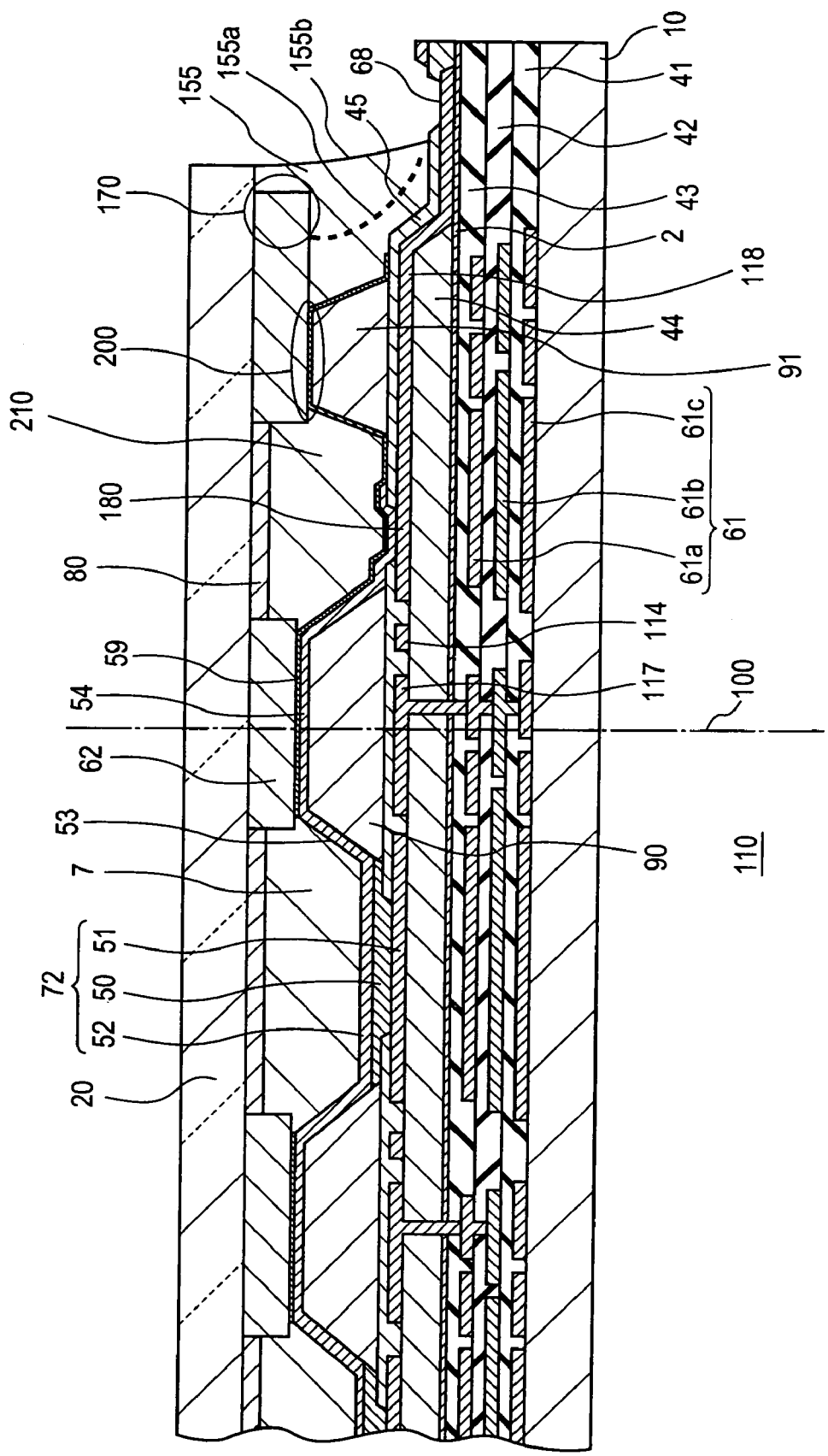
FIG. 10 is a cross-sectional view taken along line X-X in FIG. 9.

The connection between the second electrode and the second auxiliary wire and the sealing structure formed between the first substrate and the second substrate of this embodiment will now be described with reference to FIGS. 9 and 10. FIG. 9 is a plan view showing the position of terminals of this embodiment, and FIG. 10 is a cross-sectional view taken along line X-X in FIG. 9. In FIGS. 9 and 10, the same reference numerals are given to the same structural elements as those of the embodiment shown in FIGS. 1 to 8, and the explanation therefor is omitted.

As shown in FIG. 9, first auxiliary power terminals 63, second auxiliary power terminals 68, and signal line terminals 120 are formed on the outer peripheral portion of the first substrate 10. A sealing member 200 is formed at the outer peripheral side of the organic EL panel 100.

The first auxiliary power terminals 63 supply power to the first auxiliary wire 61. The power circuit 500 (refer to FIG. 1) is electrically connected to the first auxiliary wire 61 via the first auxiliary power terminals 63. First auxiliary power terminals 63a, 63b, and 63c respectively corresponding to the first auxiliary wires 61a, 61b, and 61c are arranged so that they can be connected to an external circuit via one connector.

The second auxiliary power terminals 68 supply power to the second auxiliary wire 62 (see FIG. 4). The common electrode potential (LCOM) of the power circuit 500 (see FIG. 1) is electrically connected to the second auxiliary wire 62 via the second auxiliary power terminals 68. The second auxiliary power terminals 68 are disposed near the first auxiliary power terminals 63, and can be connected to an external circuit using one connector. The second auxiliary power terminals 68 are advantageous in terms of cost and space.

The signal line terminals 120 connect the data line driving circuit 130, the scan line driving circuit 150, and the power circuit 500 (see FIG. 1) to the scan line 112, the data line 114, and the main power lines LR, LG, and LB.

The sealing member 200 is a sealing structure that defines the image forming region between the first substrate 10 and the second substrate 20.

In FIGS. 9 and 10, the second auxiliary wire 62 supplies auxiliary power to the second electrode 52, and the sealing member 200, which is an electrical connecting portion for the second electrode 52 and the second auxiliary wire 62 is disposed in the region surrounding the entire periphery of the image display region 110. With this structure, a metal junction is formed between the second electrode 52 and the second auxiliary wire 62 in the region entirely surrounding the effective region. The metal junction is preferably formed under a vacuum of $10^{-7}$ Toor or less. In this manner, the electrical connection between the second electrode 52 and the second auxiliary wire 62 can be securely formed, and a sealing structure covered with an inorganic material mainly composed of a metal can be formed to define the image display region 110. Alternatively, in a space 210 inside the sealing member 200, an absorbent that absorbs undesirable substances such as water or oxygen may be provided on the light-scattering layer 80 or instead of the light-scattering layer 80. The sealing structure prevents degradation-of the second electrode 52 and the organic EL element 72 due to undesirable substances such as water and oxygen from both inside and outside.

Metal Junction or Metal Bridge

The junction between the second electrode 52 and the second auxiliary wire 62 of this embodiment will now be described with reference to FIG. 10.

As shown in FIG. 10, a metal junction or a metal bridge is formed between the second electrode extended portion 54 and a portion of the second auxiliary wire 62 to be connected to the second electrode extended portion 54.

In this application, the metal junction or bridge is formed by the process utilizing metal migration, ultrasonic waves, or colossal resistance change induced by electric fields. According to this process, the junction becomes stronger and lower resistance can be achieved in comparison with the case in which the second electrode extended portion 54 is joined with the second auxiliary wire 62 by press bonding or by using an adhesive. Since no step of applying an adhesive is required, the problem of the adhesive protruding out in the opening region of the electrooptic element does not occur. Thus, the process is advantageously employed to achieve higher definition. Moreover, even when the electrical conduction is broken by the breaking of the metal bridge, the electrical conduction can be recovered by again causing the metal migration.

In the bonding process using supersonic waves, the bonding can be performed at a low temperature of 100° C. or less by using a low melting point metal such as indium in the junction surface. It is also possible to bond only the sealing member 200 with supersonic waves and to bond the image display region 110 by metal migration. The space 7 between the organic EL element 72 and the second substrate 20 may be put under a high vacuum so that the junction surface is constantly pressurized by the ambient pressure, thereby ensuring the stable bonding.

In order to achieve a stable bonding state, the surface of the second electrode extended portion 54 is preferably coated with a thin film 59 containing at least one of Au, Ag, Cu, Ti, Ni, and Al by mask deposition, sputtering, or the like.

The process for causing metal migration will now be described.

Referring to FIG. 10, the portion of the second auxiliary wire 62 that is located at the outermost peripheral position and that is protruding out from the spacer 90 constitutes a migration power supply terminal 170.

The second auxiliary power terminals 68 are electrically connected to the second electrode 52 at a connecting part 180 between a spacer 91 located at the outermost periphery and the adjacent spacer 90. The connection is made via a second electrode wire 118 that extends under the spacer 91. Thus, it becomes possible to electrically connect the second electrode 52 to the second auxiliary power terminals 68 without impairing the sealing effect brought about by the connection between the second electrode 52 and the second auxiliary wire 62. Moreover, the spacer 91 is completely covered with the thin film 59 composed of a metal having low activity and prevents entrance of water and oxygen. If the second electrode wire 118 is formed to extend from the connecting part 180 to the signal line terminal 120 by passing over the spacer 90, it becomes no longer possible to continuously surround the image display region 110 by the sealing member 200 formed as metal junction, thereby impairing the sealing effect.

In this embodiment, application of a voltage between the migration power supply terminal 170 and the motor 68 causes metal migration to occur between the second electrode 52 and the second auxiliary wire 62. The voltage application is conducted as follows. As shown in FIG. 9, the migration power supply terminal 170 and the second auxiliary power terminal 68 are disposed in at least two corners of the first substrate 10 or the second substrate 20, and a predetermined voltage of about several to 10 volts is applied from the terminals having contact faces positioned to achieve the same potential. Voltage application is conducted after bonding the first substrate 10 with the second substrate 20 in vacuum or under reduced pressure and after sealing or preliminarily sealing the space between the first substrate 10 and the second substrate 20 with a sealant 155 filled up to a broken line 155a, as shown in FIG. 10. After the migration, the sealant 155 is additionally supplied to fill the space up to a line 155b. In this manner, corrosion of the migration power supply terminal 170 during the subsequent manufacturing process and after completion of the product can be prevented.

In order to allow migration to uniformly occur in the respective connecting parts, the pixel driving circuits may be sequentially and selectively driven to conduct between the second auxiliary wire 62, the second electrode 52, the first electrode 51, and the first auxiliary wire 61 via the organic EL element in the selected pixel so that migration occurs in a particular position.

The second electrode extended portion 54 is composed of metal that can easily form a metal junction or a metal bridge. Examples of such a metal include Cu, Ag, and In. In order to further facilitate the metal migration, an accelerator may be disposed between the junction interface. For example, when the auxiliary wire is composed of Cu, a solid electrolyte such as copper sulfate (CuS) is preferably used. On the other hand, the portions other than the junction may be coated with a substance that can inhibit metal migration so that the electrooptic element, the semiconductor driving element, and the like are not affected. For example, when the auxiliary wire is made of Cu, the portions other than the junction may be coated with Ta to prevent migration of copper.

The area of the second auxiliary wire 62 facing the second electrode extended portion 54 may be larger than the area of the second electrode extended portion 54 facing the second auxiliary wire 62. In this manner, the area of the connection between the second electrode extended portion 54 and the second auxiliary wire 62 can be securely obtained even when there is misalignment. Moreover, since the volume of the second auxiliary wire 62 can be increased, a sufficient amount of copper, which is the source of the metal migration, can be securely obtained. Note that if the area of the connecting part is large enough to form a metal junction or metal bridge, the area of the auxiliary wire facing the extended part may be smaller than the area of the extended part facing the auxiliary wire.

In order to form a junction-type low-resistance conduction channel by utilizing an electrical field-induced colossal electro-resistance effect, a layer containing an oxide of a transition metal, such as NiO, YBaCuO, or PrBaCuO, that can generate the electrical field-induced colossal electro-resistance effect (Colossal Electro-Resistance or CER) in the above-described solid electrolyte portion or the thin-film layer is formed and a predetermined voltage pulse or current pulse is applied to form the channel. This is similar to the generation of the metal migration.

Second Embodiment

Figure 11:
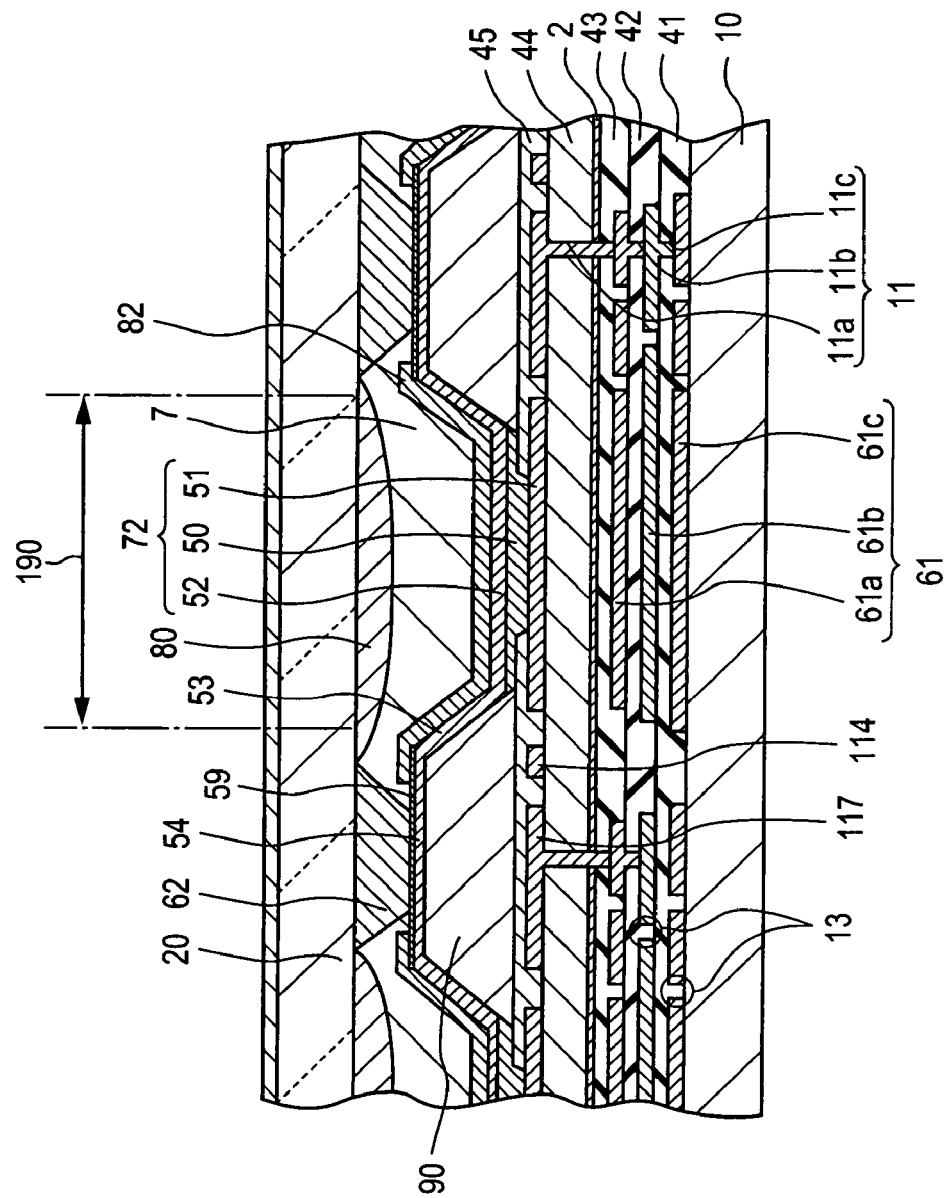
FIG. 11 is a cross-sectional view of a second embodiment similar to FIG. 4 of the first embodiment.

An organic EL device according to a second embodiment will now be described with reference to FIG. 11. FIG. 11 is a cross-sectional view similar to that of the first embodiment shown in FIG. 4. In FIG. 11, the components identical with those of the first embodiment shown in FIG. 4 are represented by the same reference numerals and the descriptions therefor are omitted.

As shown in FIG. 11, the light-scattering layer 80 of the second embodiment has a shape of a lens. Thus, the light generated in the organic EL element 72 can be focused through the light-scattering layer 80 in a perpendicular direction with respect to the second substrate. Thus, the light-extraction efficiency can be further increased. The lens-shaped light-scattering layer 80 is interposed between the first substrate 10 and the second substrate 20 so that the light extraction efficiency can be further increased compared to when the light-scattering layer 80 is provided outside the second substrate 20. This feature is primarily achieved by the method of the subject application in which micro lenses are formed in the separate process from that of making the first substrate.

Note that these micro lenses may be of a type that does not have a light-scattering function.

As shown in FIG. 11, the first auxiliary wire 61 includes first auxiliary wires (conductive films) 61a, 61b, and 61c corresponding to the type of the organic EL element 72. The first auxiliary wires 61a, 61b, and 61c are connected to one another.

For example, in a FGB full color display apparatus, the optimum driving voltage and power consumption differ according to the color of emitted light and the mode of the display screen. Thus, the versatility of arranging the auxiliary wires can be enhanced by forming the first auxiliary wire 61 as a three-layer, two-layer, or a single-layer structure depending on the display mode. Moreover, the power source cross-talk can be easily and effectively decreased. For example, the first auxiliary wire 61 may be arranged as the two-layer structure so as to correspond with a color that require large power supply and a color that does not require large power supply. Thus, the characteristics can be easily and economically optimized.

Third Embodiment

Figure 12:
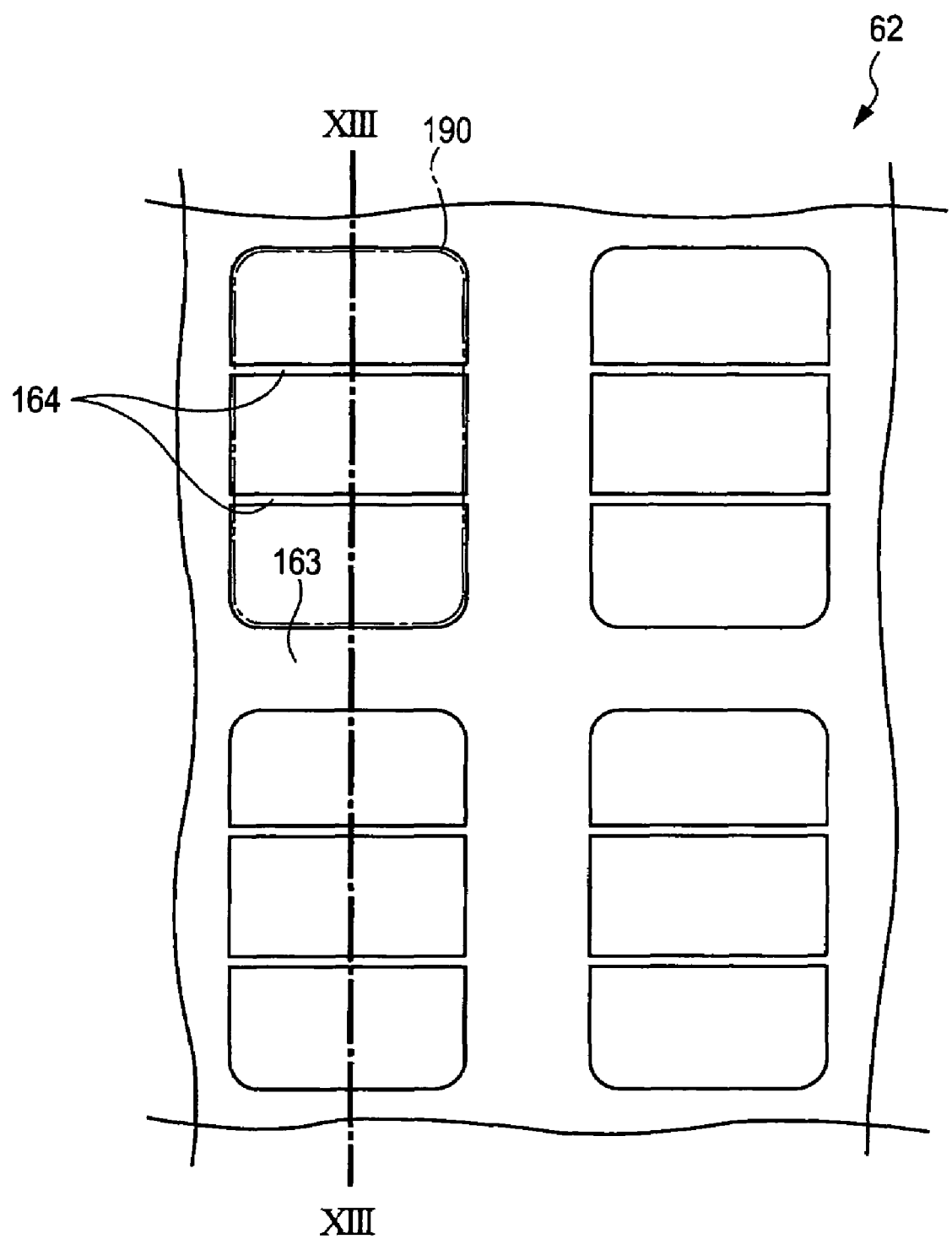
FIG. 12 is a plan view showing the planar shape of a second auxiliary wire according to a third embodiment.
Figure 13:
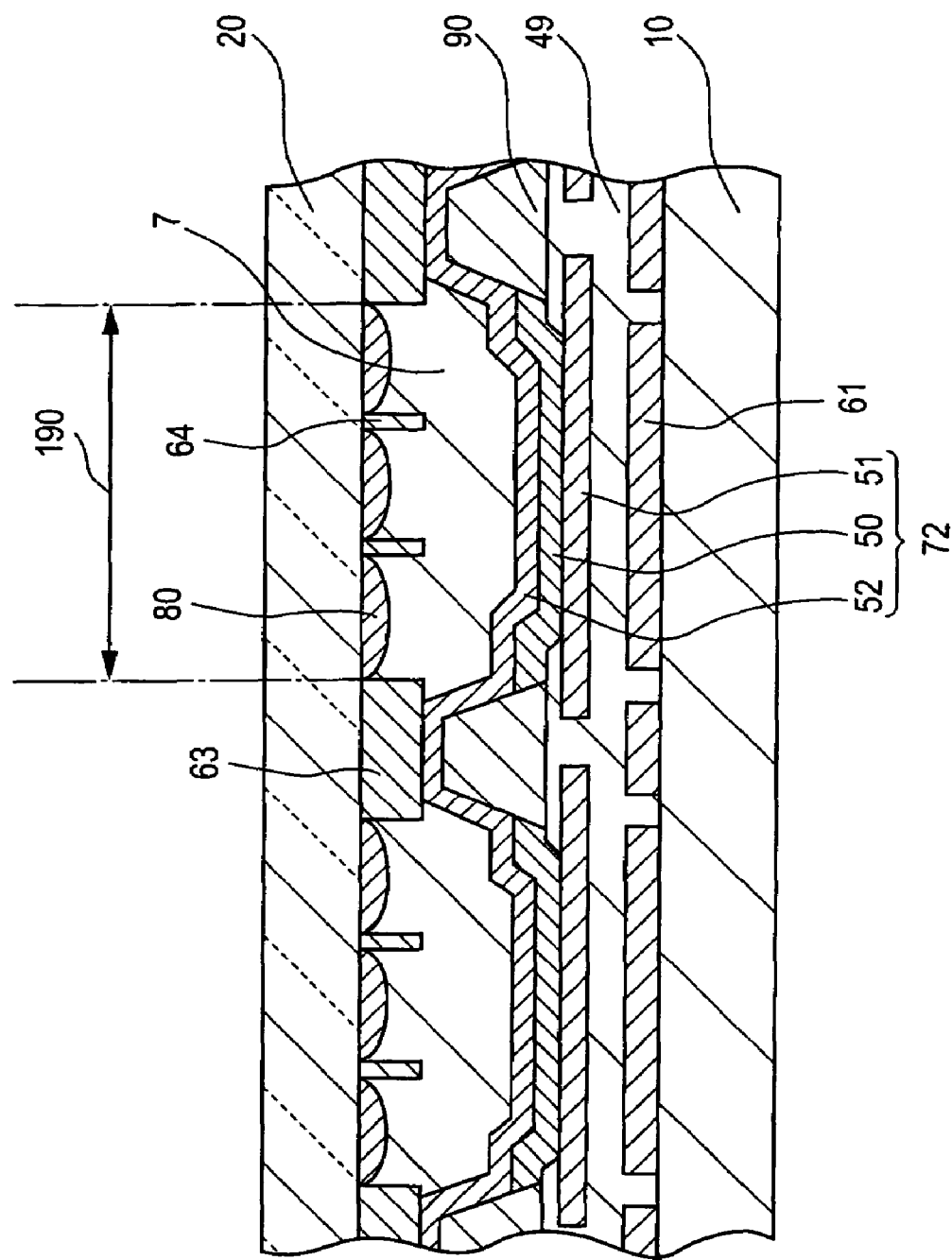
FIG. 13 is a cross-sectional view of a pixel unit according to the third embodiment taken along line XIII-XIII of FIG. 12.

An organic EL device according to a third embodiment will now be described with reference to FIGS. 12 and 13. FIG. 12 is a plan view showing a second auxiliary wire of the third embodiment. FIG. 13 is a cross-sectional view of a pixel unit of the third embodiment taken along line XIII-XIII in FIG. 12. In FIGS. 12 and 13, the components similar to those of the first embodiment shown in FIGS. 1 to 10 are represented by the same reference numerals, and the descriptions therefor are omitted.

As shown in FIG. 12, the organic EL device of the third embodiment has a fine second auxiliary wire 62 has fine lines 164 in the opening region 190 of the organic EL element 72.

The second auxiliary wire 62 contains a low-reflection material and has a particular planar pattern that at least partly covers the non-opening region of the pixel unit 70. In this manner, the second auxiliary wire 62 also serves as a black mask or a black matrix. In addition, as shown in FIGS. 12 and 13, the fine lines 164 having smaller line width and formed simultaneously with the second auxiliary wire 62 are formed in the opening region 190 so that the decrease in aperture ratio is prevented as much as possible. The fine lines 164 divide the opening region 190 of the light-scattering layer 80 into a plurality of segments. By dividing the light-scattering layer 80 into segments, the refractive index of each lens-shaped segment of the light-scattering layer 80 can be increased, and the amount of light emitted in the front direction can be further increased.

When this technology is applied to a display apparatus, the fine lines 164 are formed in a horizontal direction so that the amount of the external light entering the opening region 190 from above; such as ceiling light, can be decreased. Moreover, the fine lines 164 limit the light emitted in an oblique direction. Thus, the angular dependency of the display color can be suppressed. As a result, it becomes possible to display high-quality images with high contrast and sharpness.

Fourth Embodiment

Figure 14:
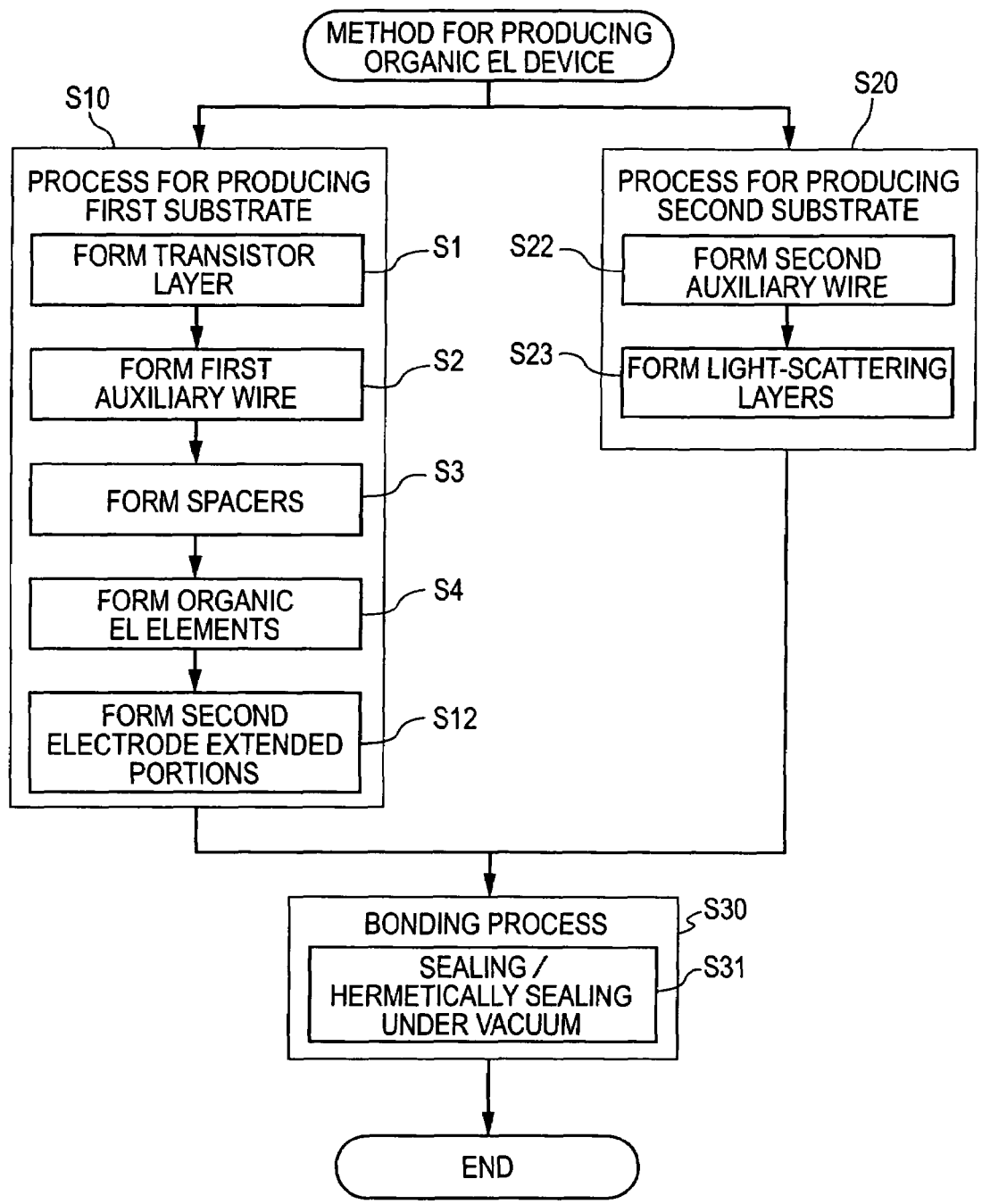
FIG. 14 is a flow chart showing a method for making an organic EL device according to a fourth embodiment.

A method for making an organic EL device according to a fourth embodiment will now be described with reference to FIGS. 3, 4, and 14. FIG. 14 is a flow chart showing the method for making the organic EL device of the fourth embodiment.

In step S1, the first auxiliary wire 61, which is constituted from a single layer or a plurality of layers, and contact holes 11b and 11c isolated from one another with insulating layers (41, 42, and 43) therebetween are formed on the first substrate 10. The metal contamination preventing layer 2 is formed to prevent metal contamination, and then the switching transistor 76, the driving transistor 74, and the hold capacitor 78 for driving the organic EL element 72 are formed on the metal contamination preventing layer 2 in step S2. The layers for the first electrode 51 and the power supply line 117 are formed by sputtering and then patterned in a single step by photolithography; subsequently, the resulting first electrode 51 and the power supply line 117 are covered with the insulating protective layer 45. The spacers 90 and 91 are formed on the protective layer 45 by photolithography (step S3). The protective layer 45 in the opening portion of the organic EL element 72 and the connecting part 180 is removed, and the organic EL layer 50 and the second electrode 52 are formed on the exposed portion of the first electrode 51 to prepare the organic EL element 72. At the top of the spacer and on the sealing member 200, the thin film 59 composed of a metal having a low activity is formed on the second electrode 52 (step S4). Subsequently, a passivation film 82 for preventing permeation of water, oxygen, or the like may be formed at least on the surface of the image display region 110. The passivation film 82 may be a single layer solely composed of an inorganic material or a laminate composed of inorganic material and an organic film, e.g., $SiN_xO_y$. The making of the first substrate 10 is thus completed through steps S1 to S4 (step S10).

In a process different from the process for making the first substrate 10, the second substrate formation steps are performed by forming the second auxiliary wire 62 on the second substrate 20 (step S20). Subsequently, the first substrate 10 and the second substrate 20 are aligned with a CCD camera or a laser alignment machine and are fixed and sealed by pressure bonding (bonding step, S30).

According to the method for making the organic EL device of this embodiment, the second substrate forming process is independent from the first substrate forming process. Thus, the second auxiliary wire 62 having a low resistance can be made, and a complicated shape can be formed by patterning. On the other hand, in the first substrate forming process independent from the second substrate forming process, the resistances of the power supply line 117 and the second electrode 52 can be reduced. Therefore, as is previously explained in connection with the organic EL device of the first embodiment, an organic EL device that can provide high-quality images with a drastically reduced brightness variation caused by power supply cross-talks can be easily manufactured.

In step S4 of this embodiment, the organic EL layer 50 is formed so that the organic EL layer 50 does not extend to the region opposing the second auxiliary wire 62. One organic EL layer 50 is formed for every pixel unit 70, and the organic EL layers 50 are separated from each other. Each organic EL layer 50 does not extend to the region overlapping the spacer 90.

In the bonding step, the extended portion of the second electrode 52 and the second auxiliary wire 62 are highly precisely aligned and pressure-bonded under a reduced pressure so as to fix and seal at least the outer periphery of the spacer 91 constituting the sealing member 200. This step is referred to as step S31. The substrates may be bonded by filling the space 7 with an adhesive in the image display region 110.

According to this embodiment, the connection between the extended portion of the second electrode 52 and the second auxiliary wire 62 are highly stable. This is because, the first substrate 10 and the second substrate 20 are bonded and sealed together with a sealant under a reduced pressure. Thus, when the organic EL device is placed under an atmospheric pressure, the interior of the image display region 110 is put under a negative pressure. Thus, the contact faces are always pressurized under an atmospheric pressure.

Fifth Embodiment

Figure 15:
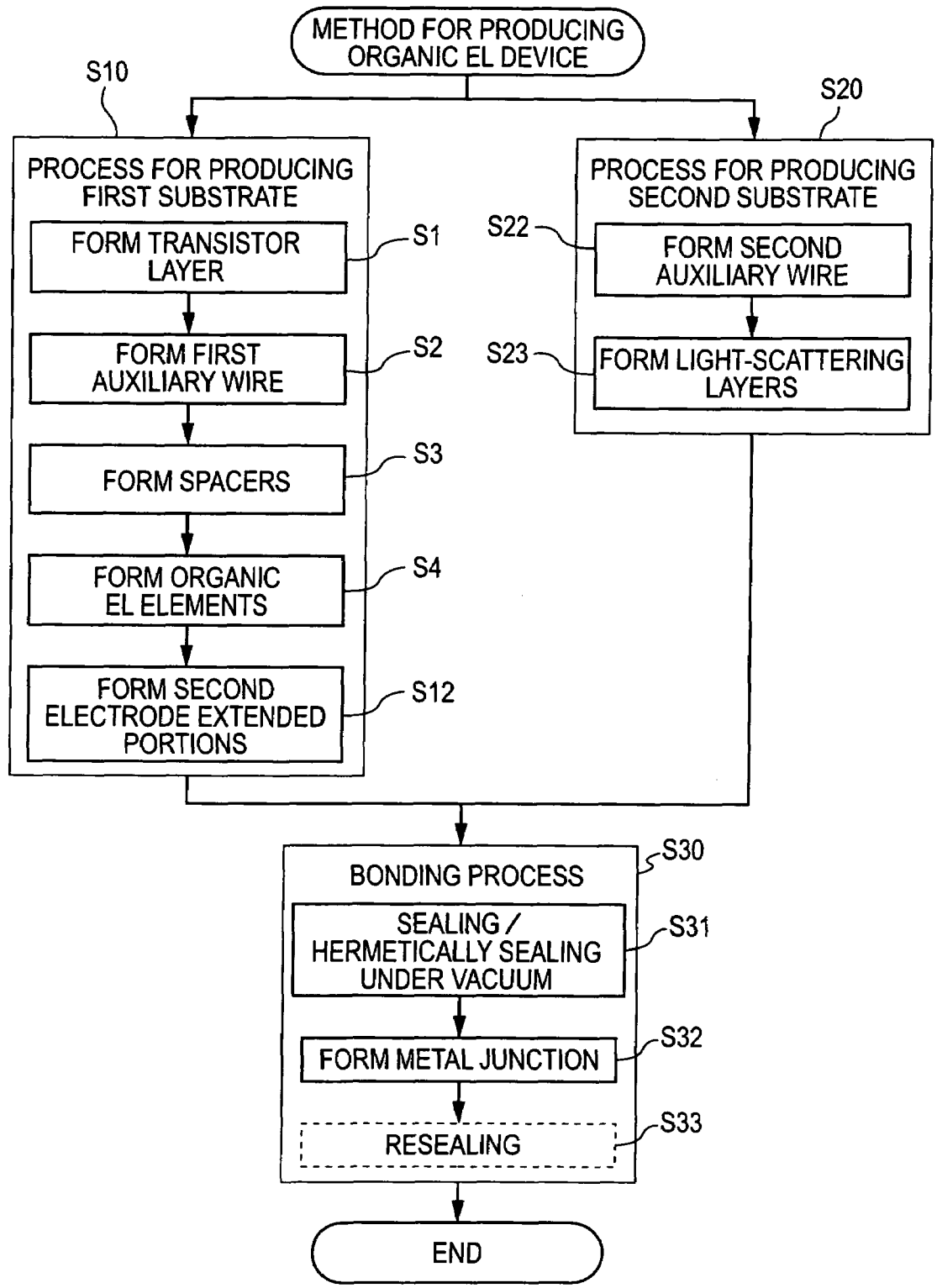
FIG. 15 is a flow chart showing a method for making an organic EL device according to a fifth embodiment.

Next, a method for making an organic EL device according to a fifth embodiment will now be described with reference to FIGS. 10 and 15. FIG. 15 is a flow chart showing the method for making the organic EL device of this embodiment. In FIG. 15, the same components as those referred in the production method of the fourth embodiment are represented by the same reference numerals, and the descriptions therefor are omitted.

In this embodiment, in addition to the steps of the fourth embodiment, a step (S32) of forming a metal joint at the connecting portion between the second electrode extended portion 54 and the second auxiliary wire 62 is provided after the bonding step. The formation of the metal joint is performed by metal migration or supersonic joining. According to a metal migration technique, a predetermined voltage is applied between the migration power supply terminal 170 and the second auxiliary power terminal 68 to allow a current to flow between the second electrode 52 and the second auxiliary wire 62 and to thereby induce metal migration. A metal bridge having a low resistance of 1 Q or less is formed in the region where metal migration occurred. The voltage application is conducted by providing the migration power supply terminal 170 and the second auxiliary power terminal 68 in at least two corners of the first substrate 10 or the second substrate 20 and then applying a predetermined voltage of several to several ten volts from the terminals having contact faces entering substantially the same potential. Moreover, in order to allow migration to uniformly occur in the respective connecting portions, the pixel driving circuit is selectively and sequentially operated in a predetermined order so as to connect the second auxiliary wire 62, the second electrode 52, the first electrode 51, and the first auxiliary wire 61, and to thereby cause migration.

When a supersonic joining technique is employed, metal bonding is realized by scanning the second substrate with a supersonic probe while adequately heating the substrate and locally applying high vibration to the junction face to achieve metal bonding. In this manner, the connecting portions can maintain strong yet low resistance connection state. Note that the supersonic joining may be performed only for the sealing member 200.

Electronic Apparatuses

Various electronic apparatuses incorporating the organic EL devices produced by the above-described methods will now be described.

A. Portable Computer

Figure 16:
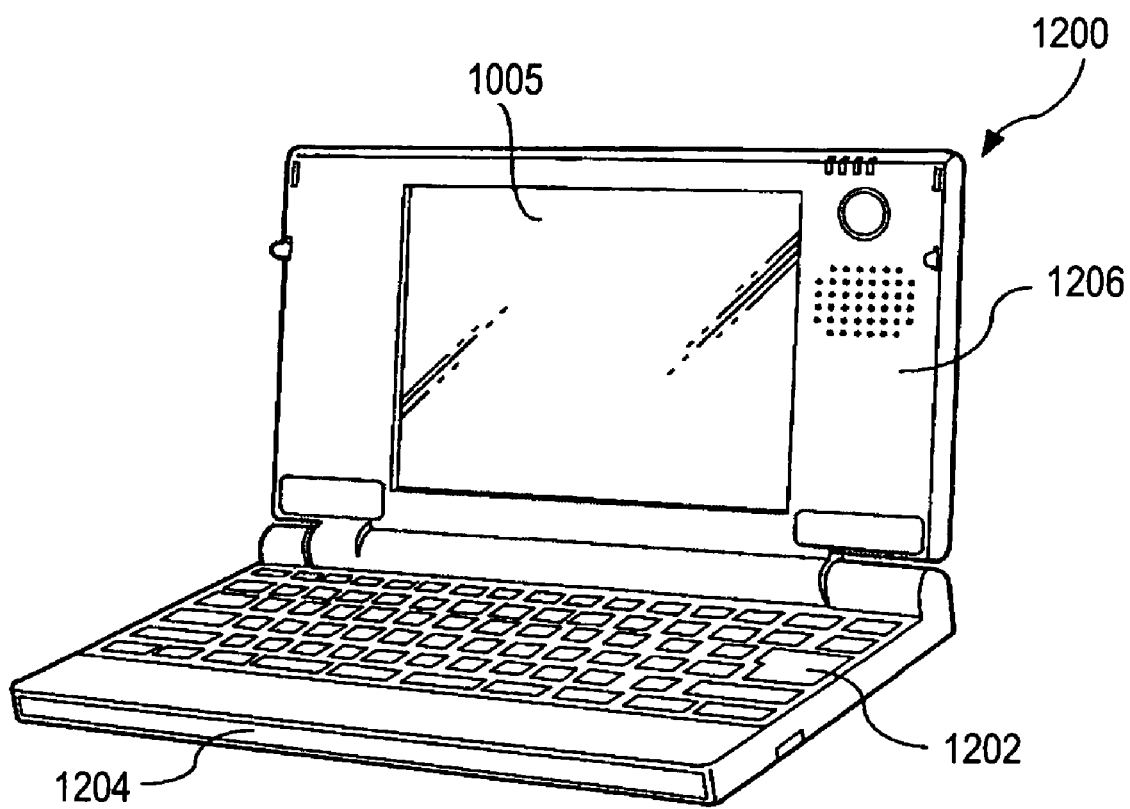
FIG. 16 is a perspective view showing the structure of a personal computer, which is one example of an electronic apparatus incorporating the electrooptic device.

A portable personal computer in which one example of the organic EL device described above is applied to a display is described below with reference to FIG. 16. FIG. 16 is a perspective view showing the structure of a computer 1200.

As shown in FIG. 16, the computer 1200 includes a main unit 1204 having a keyboard 1202, and a display unit 1206 having a display 1005 constituted from the organic EL display device according to an embodiment. The organic EL display device can display full-color, high-quality images for long period of time.

B. Image Forming Apparatus

The electrooptic device of an embodiment may be applied to device for irradiating a photosensitive member, such as a photosensitive drum, with light based on the image data. In other words, the electrooptic device in this case includes light-emitting elements (electrooptic elements) for irradiating the photosensitive member with light and driving circuits for driving the respective light-emitting elements. In a more preferred embodiment, a structure that can perform line exposure in conformity with the size of a recording material, e.g., A4-size, A-3 size, or the like, is employed. With the electrooptic device of this embodiment, a printing machine or compound copy machine with small thickness and high performance can be made.

The present invention is not limited by the embodiments described above. Various changes, alterations, and modifications are possible without departing from the scope of the invention set forth in claims and the entire specification. Organic EL devices, methods for making the same, and electrooptic devices and electronic apparatuses incorporating the organic EL devices with such modifications and the like are also included in the technical scope of the present invention.

The entire disclosure of Japanese Patent Application No. 2005-012400, filed Jan. 20, 2005 is expressly incorporated by reference herein.

What is claimed is:

1. An electrooptic device comprising:
   a first substrate; and
   a second substrate,
   the first substrate including:
      an electrooptic element in which an electrooptic substance is interposed between a first electrode and a second electrode, the electrooptic element being disposed on a surface of the first substrate that opposes the second substrate;
      an electronic element for driving the electrooptic element; and
      a power supply wire connected to the electronic element, and
   the second substrate including:
      a auxiliary wire connected to of the electrooptic element, the auxiliary wire being disposed on a surface of the second substrate that opposes the first substrate, the auxiliary wire having a planar shape that corresponds with a non-opening region of the electrooptic element,
   wherein the second electrode is closer to the second substrate than the first electrode is;
   a spacer for regulating the distance between the first substrate and the second substrate is disposed on the first substrate or the second substrate such that the spacer is adjacent to the electrooptic element; and
   a connecting portion for supplying power from the auxiliary wire to the second electrode is disposed on a surface of the spacer,
   wherein a connecting part at which the first substrate is electrically connected to the auxiliary wire has a metal junction or metal bridge formed therein;
   wherein, in the connecting portion, the area of the auxiliary wire opposing the second electrode is larger than the area of the second electrode opposing the auxiliary wire.

2. The electrooptic device according to claim 1, wherein a thin film layer containing a particular metal for promoting the formation of the metal junction or the metal bridge is formed on the second electrode in at least the connecting portion.

3. The electrooptic device according to claim 1, wherein the auxiliary wire includes at least two metals selected from the group consisting of Cr, Cu, Au, Ag, Ni, Ti, W, and Mo.

4. The electrooptic device according to claim 1, further comprising plural unit circuits on the first substrate, wherein
one electrooptic element is provided for every unit circuit on the first substrate, and
the second substrate has a light-scattering layer opposing an opening region of each electrooptic element.

5. The electrooptic device according to claim 4, wherein the light-scattering layer includes a large number of micro bubbles and/or particles having an average size from half to 10 times the emission wavelength of the electrooptic element.

6. The electrooptic device according to claim 4, wherein the light-scattering layer is formed into a shape of a lens.

7. The electrooptic device according to claim 1, wherein another auxiliary wire connected to the other of the electrooptic element and the electronic element is formed at a position nearer to the first substrate than the layer in which at least one of the electrooptic element and the electronic element is formed.

8. The electrooptic device according to claim 7, wherein the second electrode is closer to the second substrate than the first electrode is,
the auxiliary wire supplies power to the second electrode, and
the other auxiliary wire supplies power to the first electrode.

9. The electrooptic device according to claim 7, wherein the electrooptic element includes a plurality of electrooptic elements corresponding to a plurality of unit circuits disposed on the first substrate, and
the power supply wire, the auxiliary wire, and the other auxiliary wire extend toward the vicinity of the unit circuits by forming a planar shape.

10. The electrooptic device according to claim 9, wherein the other auxiliary wire includes the plurality of conductive films electrically connected through contact holes in inter-layer insulating films.

11. An electronic apparatus comprising the electrooptic device according to claim 1.

12. An electrooptic device comprising:
a first substrate; and
a second substrate,
the first substrate including:
an electrooptic element in which an electrooptic substance is interposed between a first electrode and a second electrode, the electrooptic element being disposed on a surface of the first substrate that opposes the second substrate;
an electronic element for driving the electrooptic element; and
a power supply wire for supplying power to at least one of the electrooptic element and the electronic element, and
the second substrate including:
a auxiliary wire connected to the other of the electrooptic element and the electronic element, the auxiliary wire being disposed on a surface of the second substrate that opposes the first substrate, the auxiliary wire having a planar shape that corresponds with a non-opening region of the electrooptic element,
wherein another auxiliary wire connected to the other of the electrooptic element and the electronic element is formed at a position nearer to the first substrate than the layer in which at least one of the electrooptic element and the electronic element is formed;
wherein the other auxiliary wire has a slit in a region overlapping a spacer.

* * * * *